US009552887B2

(12) United States Patent
Kim et al.

(10) Patent No.: US 9,552,887 B2

(45) **Date of Patent: *Jan. 24, 2017**

(54) SEMICONDUCTOR MEMORY SYSTEMS USING REGRESSION ANALYSIS AND READ METHODS THEREOF

(71) Applicant: Samsung Electronics Co., Ltd., Suwon-si, Gyeonggi-do (KR)

(72) Inventors: Kwanghoon Kim, Hwaseong-si (KR); Jun Jin Kong, Yongin-si (KR); Changkyu Seol, Osan-si (KR); Hong Rak Son, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/811,222

(22) Filed: Jul. 28, 2015

(65) Prior Publication Data

US 2015/0332778 A1 Nov. 19, 2015

Related U.S. Application Data

(63) Continuation of application No. 14/062,092, filed on Oct. 24, 2013, now Pat. No. 9,111,626.

(30) Foreign Application Priority Data

Oct. 25, 2012 (KR) ........................ 10-2012-0119106

(51) Int. Cl.

*G11C 16/04* (2006.01)
*G11C 16/26* (2006.01)
*G11C 11/56* (2006.01)
*G11C 16/34* (2006.01)
*G11C 16/10* (2006.01)

(52) U.S. Cl.

CPC ........... *G11C 16/26* (2013.01); *G11C 11/5642* (2013.01); *G11C 16/0483* (2013.01); *G11C 16/349* (2013.01); *G11C 16/3422* (2013.01); *G11C 16/10* (2013.01)

(58) Field of Classification Search

CPC .......... G11C 16/10; G11C 16/30; G11C 16/12
USPC ............. 365/185.18, 185.12, 185.03, 185.24
See application file for complete search history.

(56) References Cited

U.S. PATENT DOCUMENTS

| | | | |
|---|---|---|---|
| 7,649,776 | B2 | 1/2010 | Abiko et al. |
| 7,649,793 | B1 | 1/2010 | Ramamoorthy et al. |
| 7,936,601 | B2 | 5/2011 | Kang et al. |
| 8,120,953 | B2 | 2/2012 | Tanaka |

(Continued)

FOREIGN PATENT DOCUMENTS

| | | |
|---|---|---|
| KR | 20090048108 | 5/2009 |
| KR | 20090117172 | 11/2009 |

*Primary Examiner* — Connie Yoha

(74) *Attorney, Agent, or Firm* — Harness, Dickey & Pierce, P.L.C.

(57) ABSTRACT

A memory system includes: a bit counter and a regression analyzer. The bit counter is configured to generate a plurality of count values based on data read from selected memory cells using a plurality of different read voltages, each of the plurality of count values being indicative of a number of memory cells of a memory device having threshold voltages between pairs of the plurality of different read voltages. The regression analyzer is configured to determine read voltage for the selected memory cells based on the plurality of count values using regression analysis.

20 Claims, 17 Drawing Sheets

(56) References Cited

U.S. PATENT DOCUMENTS

| | | | | |
|---|---|---|---|---|
| 8,725,929 | B1 | 5/2014 | Yang et al. | |
| 9,111,626 | B2 * | 8/2015 | Kim | G11C 11/5642 |
| 2008/0106936 | A1 | 5/2008 | Yang et al. | |
| 2010/0091535 | A1 | 4/2010 | Sommer et al. | |
| 2010/0118608 | A1 | 5/2010 | Song et al. | |
| 2010/0149872 | A1 | 6/2010 | Aoyagi | |
| 2010/0296350 | A1 | 11/2010 | Kim et al. | |
| 2011/0182120 | A1 | 7/2011 | Kang et al. | |
| 2011/0197015 | A1 | 8/2011 | Chae et al. | |
| 2011/0289278 | A1 | 11/2011 | Eun et al. | |
| 2012/0008414 | A1 | 1/2012 | Katz et al. | |
| 2012/0063227 | A1 | 3/2012 | Weingarten et al. | |
| 2013/0094293 | A1 | 4/2013 | Seol et al. | |
| 2013/0135932 | A1 * | 5/2013 | Lee | G11C 16/0483 365/185.12 |
| 2014/0022853 | A1 * | 1/2014 | Choi | G11C 16/24 365/189.05 |
| 2014/0269052 | A1 * | 9/2014 | Dusija | G11C 16/34 365/185.03 |

* cited by examiner

| D0 | 1 | 0 | 1 | 1 | ··· | 0 | 1 | 1 | 1 |
|---|---|---|---|---|---|---|---|---|---|
| D1 | 1 | 0 | 1 | 0 | ··· | 0 | 0 | 1 | 1 |
| D2 | 1 | 0 | 0 | 0 | ··· | 1 | 0 | 0 | 1 |
| D3 | 1 | 0 | 0 | 0 | ··· | 0 | 0 | 0 | 1 |

SEMICONDUCTOR MEMORY SYSTEMS USING REGRESSION ANALYSIS AND READ METHODS THEREOF

CROSS-REFERENCE TO RELATED APPLICATIONS

This application is a Continuation application of U.S. application Ser. No. 14/062,092, filed Oct. 24, 2013, which claims priority under 35 U.S.C. §119 to Korean Patent Application No. 10-2012-0119106, filed Oct. 25, 2012, in the Korean Intellectual Property Office, the entire contents of each of which are hereby incorporated by reference.

BACKGROUND

Field

Inventive concepts described herein relate to semiconductor memory devices, and more particularly, to memory systems capable of deciding a read level in high speed, and read methods thereof.

Description of Conventional Art

Semiconductor memory devices may be volatile or nonvolatile. The volatile semiconductor memory devices may perform read and write operations at high speeds, while contents stored therein may be lost at power-off. The nonvolatile semiconductor memory devices may retain contents stored therein even at power-off. The nonvolatile semiconductor memory devices may be used to store contents, which must be retained regardless of whether they are powered.

A flash memory device may be a typical nonvolatile semiconductor memory device. The flash memory device may be widely used as a voice and image data storing medium of information appliances such as a computer, a cellular phone, a PDA, a digital camera, a camcorder, a voice recorder, an MP3 player, a handheld PC, a game machine, a facsimile, a scanner, a printer, and the like.

With an increase in a need for a large-capacity memory device, a multi-level cell (MLC) or multi-bit memory device storing multi-bit data per cell is becoming more common. However, memory cells in an MLC memory device must have threshold voltages corresponding to four or more discriminable data states in a limited voltage window. For improvement of the data integrity, levels of read voltages for discriminating the data states must be adjusted to have optimal values.

SUMMARY

At least one example embodiment of inventive concepts provides a read method of a nonvolatile memory device including: performing read operations on selected memory cells using different read voltages, respectively; counting the number of memory cells in each of threshold voltage bands based on the data read using the different read voltages; deciding coordinate values of a probability density function corresponding to threshold voltage of the selected memory cells based on the count result; obtaining coefficients of the probability density function based on the coordinate values; and deciding a threshold voltage of a coordinate point at which a slope of the probability density function is '0', as a read voltage of the selected memory cells.

Another example embodiment of inventive concepts provides a memory system including: a nonvolatile memory device configured to read data from selected memory cells in response to a read command including read level information; and a memory controller configured to obtain a probability density function on threshold voltages of the selected memory cells based on the read data and to decide a read voltage of the selected memory cells through an analysis of a derived function of the probability density function.

At least one other example embodiment provides a memory system comprising: a bit counter configured to generate a plurality of count values based on data read from selected memory cells using a plurality of different read voltages, each of the plurality of count values being indicative of a number of memory cells of a memory device having threshold voltages between pairs of the plurality of different read voltages; and a regression analyzer configured to determine read voltage for the selected memory cells based on the plurality of count values using regression analysis.

According to at least some example embodiments, the bit counter may be configured to generate the plurality of count values by counting a number of bits having a first logic value in each of a plurality of logical resultant data, each of the plurality of logical resultant data being a result of a logical operation between data read from selected memory cells using the plurality of different read voltages.

The regression analyzer may be further configured to obtain a probability density function based on the plurality of count values, and to determine the read voltage based on the probability density function.

The regression analyzer may be further configured to determine the read voltage based on a minimum value of the probability density function.

The regression analyzer may be further configured to: determine coordinate values of the probability density function corresponding to the plurality of different read voltages of the selected memory cells based on the plurality of count values; obtain coefficients of the probability density function based on the coordinate values; and determine, as the read voltage, a threshold voltage of a coordinate point at which a slope of the probability density function is '0'.

An average of a pair of adjacent read voltages may be a first component of a first of the coordinate values from and a count value corresponding to the pair of adjacent read voltages may be a second component of the first coordinate value.

According to at least some example embodiments, the memory system may further include: a memory controller including the regression analyzer. The memory controller may further include the bit counter.

According to at least some example embodiments, the memory system may further include a nonvolatile memory including the bit counter.

According to at least some example embodiments, the memory system may further include a nonvolatile memory including the bit counter.

At least one other example embodiment provides a solid state drive including: a memory system; and a host operatively coupled to the memory system. The memory system includes: a bit counter configured to generate a plurality of count values based on data read from selected memory cells using a plurality of different read voltages, each of the plurality of count values being indicative of a number of memory cells of a memory device having threshold voltages between pairs of the plurality of different read voltages; and a regression analyzer configured to determine read voltage for the selected memory cells based on the plurality of count values using regression analysis.

At least one other example embodiment provides a computing system including: a memory system; and a processor operatively coupled to the memory system. The memory system includes: a bit counter configured to generate a plurality of count values based on data read from selected memory cells using a plurality of different read voltages, each of the plurality of count values being indicative of a number of memory cells of a memory device having threshold voltages between pairs of the plurality of different read voltages; and a regression analyzer configured to determine read voltage for the selected memory cells based on the plurality of count values using regression analysis.

With example embodiments of inventive concepts, it is possible to decide an optimal read voltage used to sense data of memory cells without an increase in a read frequency.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
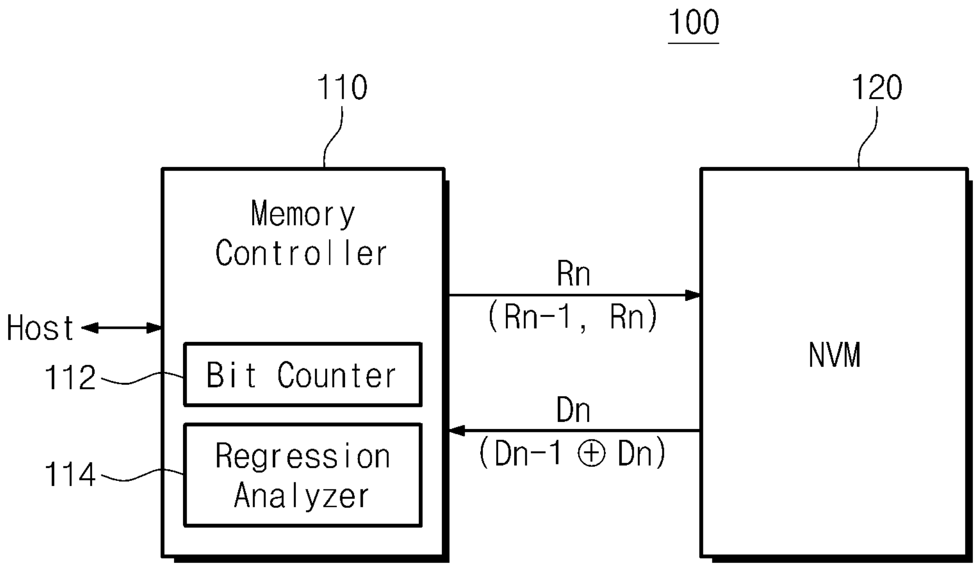
FIG. 1 is a block diagram schematically illustrating a memory system according to an example embodiment of inventive concepts.

Example embodiments will be described in detail with reference to the accompanying drawings. Inventive concepts, however, may be embodied in various different forms, and should not be construed as being limited only to the illustrated example embodiments. Rather, these example embodiments are provided as examples so that this disclosure will be thorough and complete, and will fully convey the concept of inventive concepts to those skilled in the art. Accordingly, known processes, elements, and techniques are not described with respect to some of the example embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms “first”, “second”, “third”, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as “beneath”, “below”, “lower”, “under”, “above”, “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” or “under” other elements or features would then be oriented “above” the other elements or features. Thus, the exemplary terms “below” and “under” can encompass both an orientation of above and below. The device may be otherwise oriented (rotated 90 degrees or at other orientations) and the spatially relative descriptors used herein interpreted accordingly. In addition, it will also be understood that when a layer is referred to as being “between” two layers, it can be the only layer between the two layers, or one or more intervening layers may also be present.

The terminology used herein is for the purpose of describing particular example embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, a memory system using a flash memory device will be used as an example for describing aspects and functions of inventive concepts. However, inventive concepts are not limited thereto.

In this specification, a regression analysis may mean a technique for restoring a probability density function (PDF) form using minimum samples. In this specification, the regression analysis may be used to predict a distribution of memory cells at a specific threshold voltage band. That is, a distribution valley form for discriminating different data states may be estimated using the regression analysis.

FIG. 1 is a block diagram schematically illustrating a memory system according to an example embodiment of inventive concepts.

Referring to FIG. 1, a memory system 100 may include a memory controller 110 and a nonvolatile memory device 120. The memory controller 110 may refer to a read result from the nonvolatile memory device 120 to estimate an exact distribution valley form of the probability density function according to the regression analysis. The memory controller 110 may decide an optimal read voltage based on the estimated distribution valley form.

The memory controller 110 may control the nonvolatile memory device 120 in response to a request of a host. The memory controller 110 may provide the nonvolatile memory device 120 with a write command or write data in response to a write request of the host. In response to a read request of the host, the memory controller 110 may control the nonvolatile memory device 120 to sense and output data to be read requested.

The memory controller 110 may obtain a probability density function corresponding to a distribution valley of memory cells by performing a plurality of read operations only. For example, the memory controller 110 may obtain a probability density function on threshold voltages of memory cells through four or five read operations. The memory controller 110 may acquire coordinate points of a probability density function corresponding to a distribution valley by performing a plurality of read operations. The memory controller 110 may model the probability density function corresponding to the distribution valley based on the acquired coordinate points. The memory controller 110 may obtain a minimum value of the modeled probability density function, and may decide a threshold voltage corresponding to the obtained minimum value as an optimal read voltage.

The memory controller 110 may include a bit counter 112 which obtains a coordinate point of the probability density function corresponding to the distribution valley. The bit counter 112 may decide a coordinate point of the probability density function based on data Dn read using a read voltage Rn. A coordinate point of the probability density function expressed at an orthogonal coordinate system may include a first coordinate value and a second coordinate value. The memory controller 110 may decide an average value x of read voltages Ri and R(i+1) as the first coordinate value, and may express the number y of memory cells between the read voltages Ri and R(i+1) as the second coordinate value. If a read operation is performed four times, then the bit counter 112 may obtain values of three coordinate points on the probability density function.

In the event that the probability density function corresponding to the distribution valley is modeled by a quadratic function, three coordinate points may be used as substitution values sufficient to solve the simultaneous equations. If the probability density function corresponding to the distribution valley is modeled by a cubic function, then four coordinate points may be required to solve the simultaneous equations for obtaining a coefficient of the probability density function. Thus, the number of read operations may be adjusted according to an expected form of a distribution valley deciding a probability density function form.

The memory controller 110 may include a regression analyzer 114. The regression analyzer 114 may obtain the probability density function of the distribution valley using a plurality of coordinate values. The regression analyzer 114 may obtain a minimum value of the probability density function. The regression analyzer 114 may decide a voltage level corresponding to the minimum value of the probability density function as an optimal read level.

The regression analyzer 114 may solve the simultaneous equations for obtaining the probability density function corresponding to the distribution valley of memory cells based on three or four coordinate values. If modeling of a linear probability density function using the simultaneous equations is completed, then the regression analyzer 114 may obtain a minimum value of the probability density function. If the probability density function is a quadratic function, then a slope of the probability density function, that is, a threshold voltage of which the differential value of the probability density function is '0' may be a voltage level corresponding to the minimum value of the probability density function. The regression analyzer 114 may decide this point as a read level. If the probability density function is a cubic function, then the regression analyzer 114 may decide a level of a threshold voltage corresponding to the minimum value of the probability density function differentiated as a read level.

The nonvolatile memory device 120 may include one or more memory devices. The nonvolatile memory device 120 may read selected memory cells using a read voltage Rn in response to a command of the memory controller 110. The nonvolatile memory device 120 may sense selected memory cells using different read voltages Ri and R(i+1) in response to a command of the memory controller 110. The nonvolatile memory device 120 may perform an XOR operation on data, sensed using the different read voltages Ri and R(i+1), by the same column. The nonvolatile memory device 120 may output a result of the XOR operation to the memory controller 110. At the XOR operation, the logic '1' number may correspond to the number of memory cells each having a threshold voltage between the read voltages Ri and R(i+1).

With example embodiments of inventive concepts, there may be provided an optimal read voltage on memory cells of the nonvolatile memory device 120. The memory controller 110 may decide an optimal read level through reduced and/or minimum access operations by using the regression analysis. Thus, a time taken to decide a read voltage may be reduced and/or minimized, so that the performance of the memory system is improved.

Figure 2:
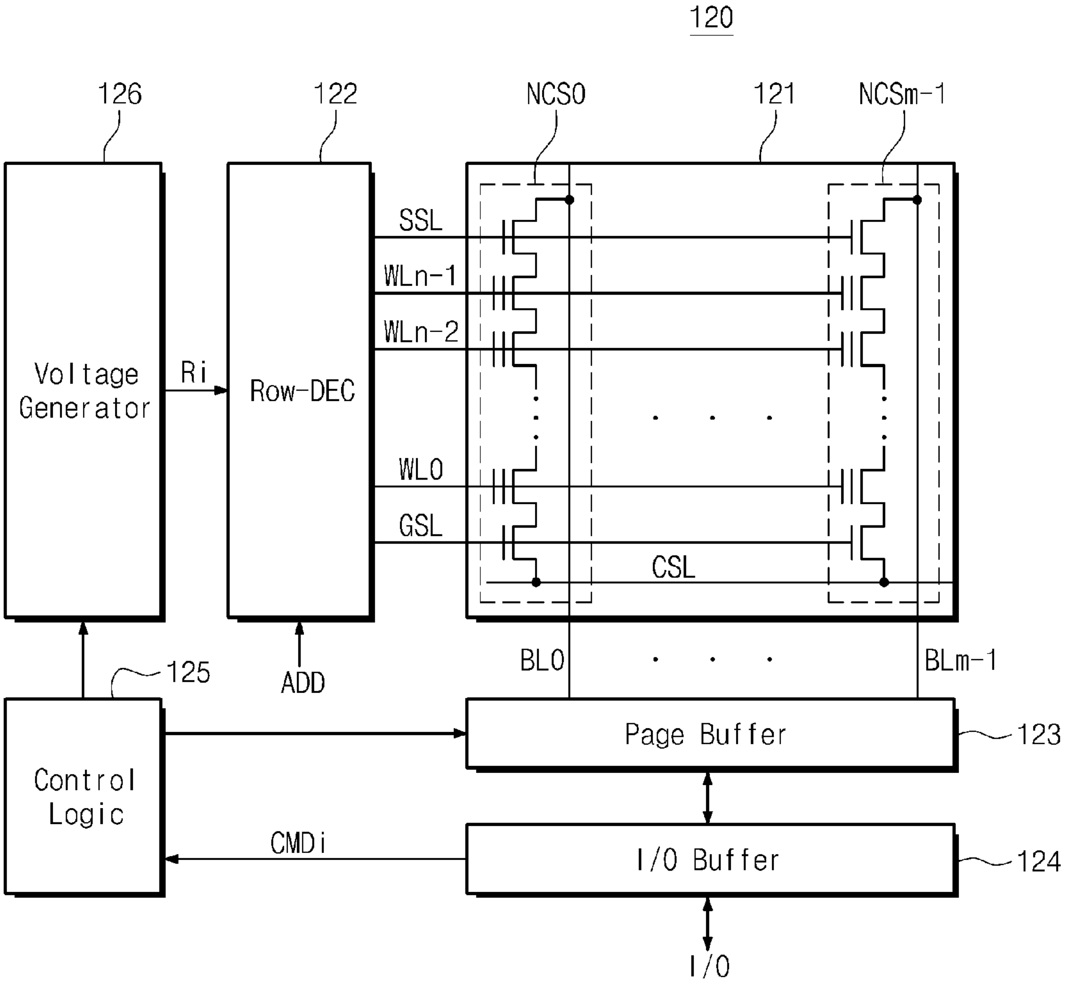
FIG. 2 is a block diagram schematically illustrating a nonvolatile memory device according to an example embodiment of inventive concepts.

FIG. 2 is a block diagram schematically illustrating a nonvolatile memory device according to an example embodiment of inventive concepts. Referring to FIG. 2, a nonvolatile memory device 120 may include a cell array 121, a row decoder 122, a page buffer circuit 123, an input/output buffer circuit 124, control logic 125, and a voltage generator 126.

The cell array 121 may be coupled with the row decoder 122 via word lines WL0~WLn−1 and selection lines SSL and GSL. The cell array 121 may be coupled with the page buffer circuit 123 via bit lines BL0~BLm−1. The cell array 121 may include a plurality of NAND cell strings NCS0~NCSm−1. The NAND cell strings NCS0~NCSm−1 may constitute a memory block BLK1. A channel of each NAND string may be formed in a vertical or horizontal direction.

In a program operation, memory cells may be selected by a page unit (e.g., 2 KB) or a unit (e.g., 512 B) less than the page unit by controlling the word lines WL0~WLn−1 and selection lines SSL and GSL. In a read operation, memory cells may be selected by a page unit or a unit less than the page unit. A threshold voltage distribution of memory cells for reading may differ from that for programming due to various factors. Thus, a level of a read voltage may be adjusted in view of a variation in threshold voltages to improve the data integrity.

The row decoder 122 may select one of memory blocks of the cell array 121 in response to an address ADD. The row decoder 122 may select one of the word lines in the selected memory block. The row decoder 122 may transfer a read voltage Ri provided from the voltage generator 126 to a selected word line. In a program operation, the row decoder 122 may transfer a program voltage/a verification voltage to a selected word line and a pass voltage to an unselected word line. In a read operation, the row decoder 122 may transfer a selection read voltage to a selected word line and a non-selection read voltage to an unselected word line.

The page buffer circuit 123 may operate as a write driver in a program operation and a sense amplifier in a read operation. In a program operation, the page buffer circuit 123 may provide a bit line of the cell array 110 with a bit line voltage corresponding to data to be programmed. In a read operation, the page buffer circuit 123 may sense data stored in a selected memory cell via a bit line. The page buffer circuit 123 may latch the sensed data to output the sensed data to an external device through the input/output buffer circuit 124.

In a program operation, the input/output buffer circuit 124 may transfer input write data to the page buffer circuit 123.

In a read operation, the input/output buffer circuit 124 may transfer read data provided from the page buffer circuit 123 to an external device. The input/output buffer 124 may transfer input address and command to the control logic 125 and the row decoder 122, respectively.

The control logic 125 may control the page buffer circuit 123 and the row decoder 122 in response to a command CMDi transferred from the external device via the input/output buffer circuit 124. The control logic 125 may control the page buffer circuit 123 and the voltage generator 126 in response to a read command from a memory controller 110 to sense selected memory cells. For example, the control logic 125 may control the page buffer circuit 123 and the voltage generator 126 to sense selected memory cells using a read voltage R designated by the memory controller 110.

The voltage generator 126 may generate word line voltages to be supplied to word lines and a voltage to be supplied, to a bulk (e.g., a well region) where memory cells are formed, under the control of the control logic 125. The word line voltages to be supplied to word lines may include a program voltage, a pass voltage, selection and non-selection read voltages, and so on. In a read/program operation, the voltage generator 126 may generate selection line voltages to be supplied to the selection lines SSL and GSL. Also, the voltage generator 126 may generate a specific read voltage Ri to be provided to the row decoder 122 under the control of the control logic 125.

The nonvolatile memory device 120 may sense, latch and output selected memory cells using a specific read voltage Ri designated by the memory controller 110. The nonvolatile memory device 120 may support a read voltage adjusting operation using the regression analysis executed at the memory controller 110.

Figure 3:
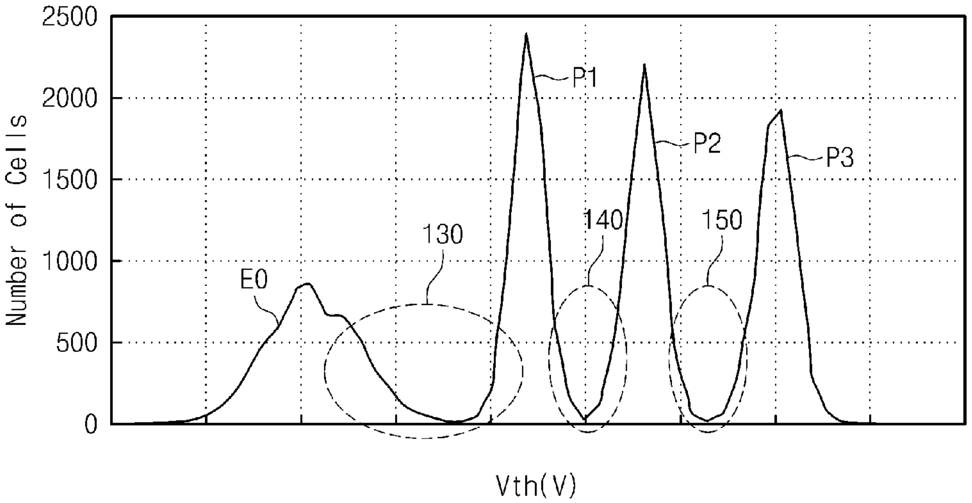
FIG. 3 is a graph illustrating an example threshold voltage distribution of multi-level cells.

FIG. 3 is a graph illustrating an example threshold voltage distribution of multi-level cells. Referring to FIG. 3, illustrated is an example threshold voltage distribution of 2-bit multi-level cells. Herein, note that a vertical axis of a graph is not a log scale.

A threshold voltage distribution of 2-bit multi-level cells may be classified into four states. For example, each memory cell may have a threshold voltage corresponding to one of an erase state E0 and program states P1, P2 and P3. A threshold voltage distribution of 2-bit multi-level cells may vary by a lapse of time and various factors. This variation may make threshold voltage states of memory cells overlap. In this case, it is relatively difficult to discriminate threshold voltage states exactly. Thus, a level of a read voltage may be adjusted. To decide a read voltage having the least bit error rate (BER) may be a factor of the data integrity.

As illustrated in FIG. 3, there may be generated distribution valleys 130, 140, and 150 indicating an overlap portion between the erase state E0 and the program state P1, an overlap portion between the program state P1 and the program state P2, and an overlap portion between the program state P2 and the program state P3, respectively. Curves corresponding to distribution valleys 130, 140, and 150 may have minimum points, respectively. If a threshold voltage corresponding to the minimum point is decided as a read voltage, the best data integrity may be provided at a read operation. Minimum points of the distribution valleys 130, 140, and 150 may be detected using a method in which memory cells are read using different read voltages (e.g., a difference between adjacent read voltages being equal) and a voltage band having the least distribution number is searched using the read result. However, this detection method may accompany an excessive numbered read operations. On the other hand, with the regression analysis according to example embodiments, if three or four coordinate points are detected, a probability density function corresponding to a distribution valley may be modeled to a linear function. Thus, an optimal read level corresponding to one of the distribution valleys 130, 140, and 150 may be decided through four or five read operations.

In a modeling method of the probability density function for locating a minimum point, the distribution valley 130 may be approached in a manner different from the distribution valleys 140 and 150. A function form of the distribution valley 130 may approximate to a cubic function. However, a function form corresponding to each of the distribution valleys 140 and 150 may approximate to a quadratic function. A difference between function forms corresponding to distribution valleys may be caused by a distance between states and a bias for a program operation. A degree of a modeled function may not be limited to this disclosure. Various degrees of functions may be modeled to have a function for locating a minimum point of a distribution valley.

In case of a 2-bit multi-level cell, probability density functions corresponding to three distribution valleys 130, 140, and 150 may be modeled. Threshold voltages corresponding to minimum values of the probability density functions corresponding to the modeled distribution valleys 130, 140, and 150 may be decided as read voltages.

Figure 4:
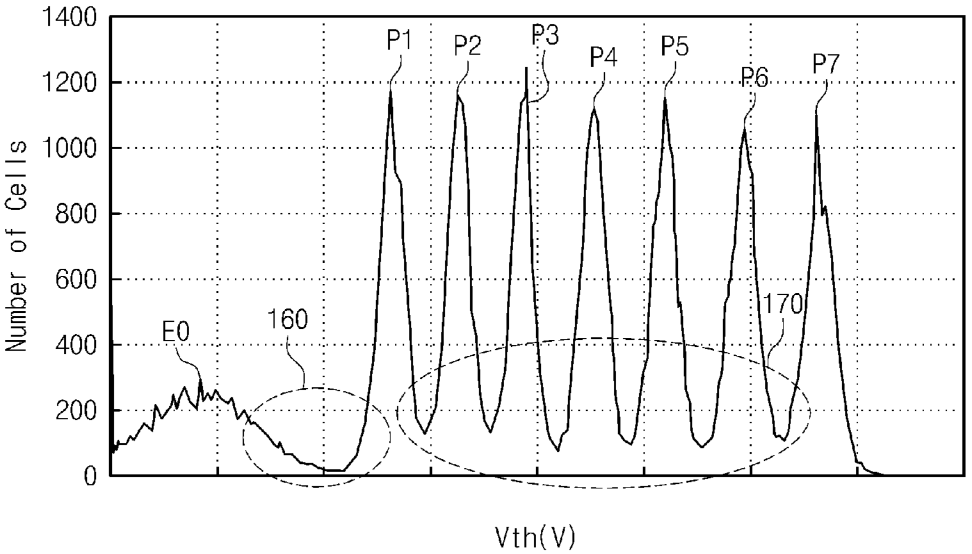
FIG. 4 is a graph illustrating an example threshold voltage distribution of 3-bit multi-level cells.

FIG. 4 is a graph illustrating a threshold voltage distribution of 3-bit multi-level cells. Referring to FIG. 4, illustrated is an example threshold voltage distribution of 3-bit multi-level cells.

A threshold voltage distribution of 3-bit multi-level cells may be classified into eight states. For example, each 3-bit multi-level cell may have a threshold voltage corresponding to one of an erase state E0 and seven program states P1, P2, P3, P4, P5, P6, and P7. A threshold voltage distribution of 3-bit multi-level cells may vary by a lapse of time and various factors. This variation may make threshold voltage states of memory cells overlap. In this case, it is relatively difficult to discriminate threshold voltage states exactly.

Distribution valleys 160 and 170 indicating overlapping portions may exist among the erase and program states E0, P1, P2, P3, P4, P5, P6, and P7. The distribution valley 160 may indicate a shape of a threshold voltage distribution of memory cells having threshold voltages between the erase state E0 and the program state P1. On the other hand, the distribution valleys 170 may indicate a shape of a threshold voltage distribution of memory cells corresponding to the program states P1, P2, P3, P4, P5, P6, and P7.

Modeling on the distribution valley 160 may be made in a manner different from the distribution valleys 170. A function form of the distribution valley 160 may approximate to a cubic function. However, a function form corresponding to the distribution valleys 170 may approximate to a quadratic function. A degree of a function applied to modeling of each of the distribution valleys 160 and 170 may not be limited to this example, and may be changed variously.

Figure 5A:
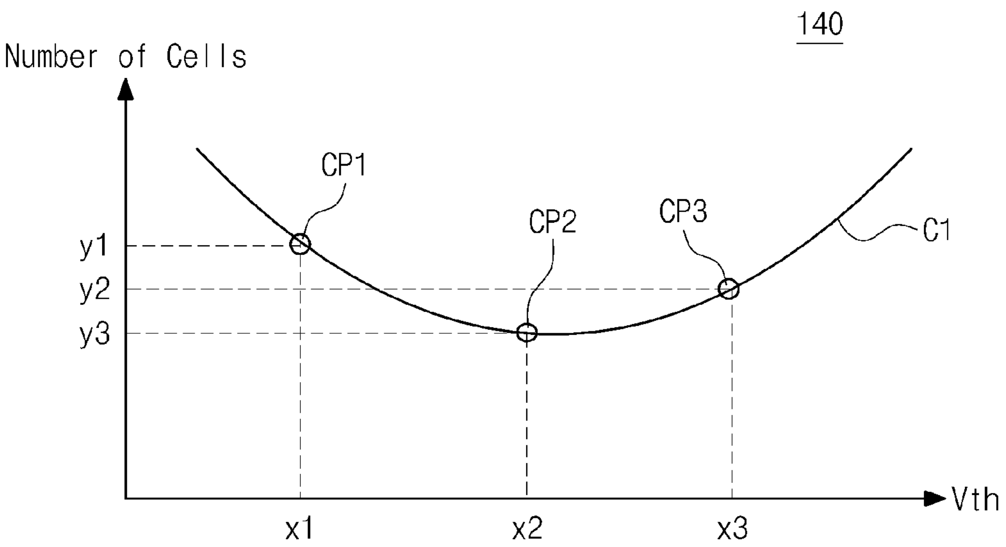
FIG. 5A shows example coordinate points for detecting a probability density function curve corresponding to a distribution valley.
Figure 5B:
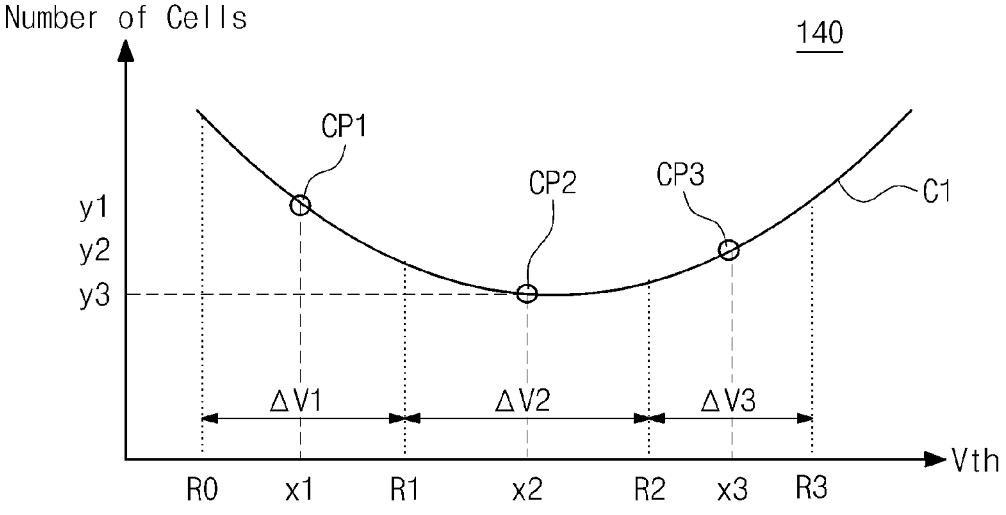
FIG. 5B shows an example read method for obtaining coordinate points of a probability density function curve.

FIGS. 5A and 5B are graphs illustrating a distribution valley form modeled by a quadratic function. FIG. 5A shows coordinate points for detecting a probability density function curve corresponding to a distribution valley 140. FIG. 5B shows a read method for obtaining coordinate points of a probability density function curve.

Referring to FIG. 5A, a curve corresponding to a probability density function corresponding to a distribution valley 140 may be modeled by a parabola C1. In case of a quadratic function corresponding to the parabola C1, the parabola C1 may have bilateral symmetry on the basis of a minimum point. The minimum point may correspond to a coordinate point of which the slope of the probability density function is '0'. That is, the minimum point of the parabola C1 may be obtained by calculating the probability density function corresponding to the parabola C1. A quadratic probability density function corresponding to the parabola C1 may be obtained by solving the simultaneous equations on a quadratic function to obtain coefficients through substitution of coordinate values of the coordinate points CP1, CP2, and CP3.

Herein, to obtain coordinate values of the coordinate points CP1, CP2, and CP3, memory cells may be sensed using read voltages Rn (n being an integer more than 0). The number yj (j being a natural number) of memory cells corresponding to a specific threshold voltage xj may be decided as a coordinate value, based on the sensed data. Coefficients of a quadratic function may be obtained through the simultaneous equations in which the decided coordinate values are substituted. The coordinate points, as illustrated in FIG. 5A, may correspond to CP1 (x1, y1), CP2 (x2, y2), and CP3 (x3, y3), respectively. At least three coordinate points CP1, CP2, and CP3 have to be provided to obtain a coefficient of the quadratic simultaneous equations. This may mean that at least four read operations are required. Herein, locations of the coordinate points CP1, CP2, and CP3 may be unrelated if they are any points on the parabola C1.

It is assumed that a parabola corresponding to the distribution valley is a quadratic function ($y=a_0+a_1x+a_2x^2$). The following equation 1 shows example simultaneous equations for obtaining coefficients $a_0$, $a_1$, and $a_2$ of a quadratic function.

$$\begin{bmatrix} y_1 \\ y_2 \\ y_3 \end{bmatrix} = \begin{bmatrix} 1 & x_1 & x_1^2 \\ 1 & x_2 & x_2^2 \\ 1 & x_3 & x_3^2 \end{bmatrix} \begin{bmatrix} a_0 \\ a_1 \\ a_2 \end{bmatrix} + \begin{bmatrix} \varepsilon_1 \\ \varepsilon_2 \\ \varepsilon_3 \end{bmatrix} \quad \text{[Equation 1]}$$

In the equation 1, $\epsilon_1$, $\epsilon_2$, and $\epsilon_3$ may be considered to be DC offsets or errors corresponding to coordinate points, respectively. However, they may be terms to be deleted by differentiation of a function for searching a minimum value.

The following equation 2 shows an example vector polynomial expression generalized regardless of a degree of the equation 1.

$$y=Xa+\epsilon \quad \text{[Equation 2]}$$

The following equation 3 shows an example of a more general solution of the equation 2.

$$a=X^{-1}y \quad \text{[Equation 3]}$$

The coefficients $a_0$, $a_1$, and $a_2$ of a quadratic function corresponding to the equation 3 may be obtained by solving the equation 1 using coordinate values of the coordinate points CP1, CP2, and CP3. Afterwards, the following equation 4 shows such an example root $x_{opt}$ that a value obtained by differentiating a quadratic function having the coefficients $a_0$, $a_1$, and $a_2$ is '0'.

$$x_{opt} = -\frac{a_1}{2a_2} \quad \text{[Equation 4]}$$

There is described an example in which the probability density function corresponding to the distribution valley 140 is modeled by a quadratic function. In this case, the probability density function may be obtained by substituting three coordinate values at a quadratic function. There is described the regression analysis capable of deciding a threshold voltage corresponding to a minimum value of the quadratic function obtained as an improved or optimal read voltage.

Three coordinate values on a probability density function curve having required data modeled may be obtained to apply the regression analysis. A method of obtaining the coordinate points CP1 (x1, y1), CP2 (x2, y2), CP3 (x3, y3) will be more fully described with reference to FIG. 5B.

FIG. 5B is a graph illustrating an example method of obtaining coordinate values of coordinate points. Referring to FIG. 5B, three coordinate values may be calculated to obtain a quadratic function corresponding to a distribution valley 140. This may mean that at least four read operations are required. Read voltages Ri ($1 \leq i \leq 3$) provided at the read operations may be different from one another.

Read operations using read voltages R0 and R1 may be performed to obtain a coordinate point CP1 (x1, y1). Data may be read from selected memory cells using the read voltage R0, and the read data may be binary logic values. For example, data read from a memory cell having a threshold voltage lower than the read voltage R0 may be latched by logic '1'. On the other hand, data read from a memory cell having a threshold voltage higher than the read voltage R0 may be latched by logic '0'. Memory cells, having threshold voltages higher than the read voltage R0 and lower than the read voltage R1, from among the selected memory cells may be sensed as off cells when the read voltage R0 is applied to a selected word line and as on cells when the read voltage R1 is applied to a selected word line. If an XOR operation is performed with respect to data D0 read by the read voltage R0 and data D1 read by the read voltage R1 by a column unit, the number of memory cells corresponding to a voltage band ΔV1 may be obtained.

A bit counter 112 (refer to FIG. 1) may count the number of memory cells having threshold voltages belonging to the voltage band ΔV1 in the above-described manner. At this time, a coordinate value x1 of the coordinate point CP1 may be mapped with a median of the read voltages R0 and R1. That is, the coordinate value x1 may be mapped with (R0+R1)/2. A coordinate value y1 of the coordinate point CP1 may be mapped with the number of memory cells having threshold voltages belonging to the voltage band ΔV1.

Read operations using the read voltages R1 and R2 may be required to obtain the coordinate point CP2 (x2, y2). If an XOR operation is performed with respect to data D1 read by the read voltage R1 and data D2 read by the read voltage R2, the number of memory cells having threshold voltages belonging to a voltage band ΔV2 may be obtained. The number of memory cells corresponding to the voltage band ΔV2 may be mapped with a coordinate value y2. A coordinate value x2 of the coordinate point CP2 may be mapped with a median of the read voltages R1 and R2. That is, the coordinate value x2 may be set to (R1+R2)/2.

Read operations using the read voltages R2 and R3 may be required to obtain the coordinate point CP3 (x3, y3). If an XOR operation is performed with respect to data D2 read by the read voltage R2 and data D3 read by the read voltage R3, the number of memory cells having threshold voltages belonging to a voltage band ΔV3 may be obtained. The number of memory cells corresponding to the voltage band ΔV3 may be mapped with a coordinate value y3. A coordinate value x3 of the coordinate point CP3 may be mapped with a median of the read voltages R2 and R3. That is, the coordinate value x2 may be set to (R2+R3)/2.

Herein, the voltage band ΔV1 corresponding to an interval between the read voltage R0 and the read voltage R1, the voltage band ΔV2 corresponding to an interval between the read voltage R1 and the read voltage R2, and the voltage band ΔV3 corresponding to an interval between the read voltage R2 and the read voltage R3 may be set to have the same or substantially the same value or different values. If the voltage bands ΔV1, ΔV2, and ΔV3 have the same or substantially the same width, then there may be provided read voltages sequentially increasing by a constant voltage interval from the read voltage R0. Thus, it is easier to generate the read voltages. If the read voltages R1, R2, and R3 are generated using a read voltage R0, increments ΔV1, ΔV2, and ΔV3 may be set to have the same or substantially the same value.

There is described a procedure of obtaining three coordinate values to model the probability density function corresponding to the distribution valley 140 by a quadratic function. If the three coordinate values are gained, then the simultaneous polynomial expression may be constituted. Then, coefficients of the probability density function may be gained by substituting the coordinate values at the simultaneous polynomial expression. A threshold voltage corresponding to a minimum value on the probability density function may be decided as an optimal read voltage.

Figure 6A:
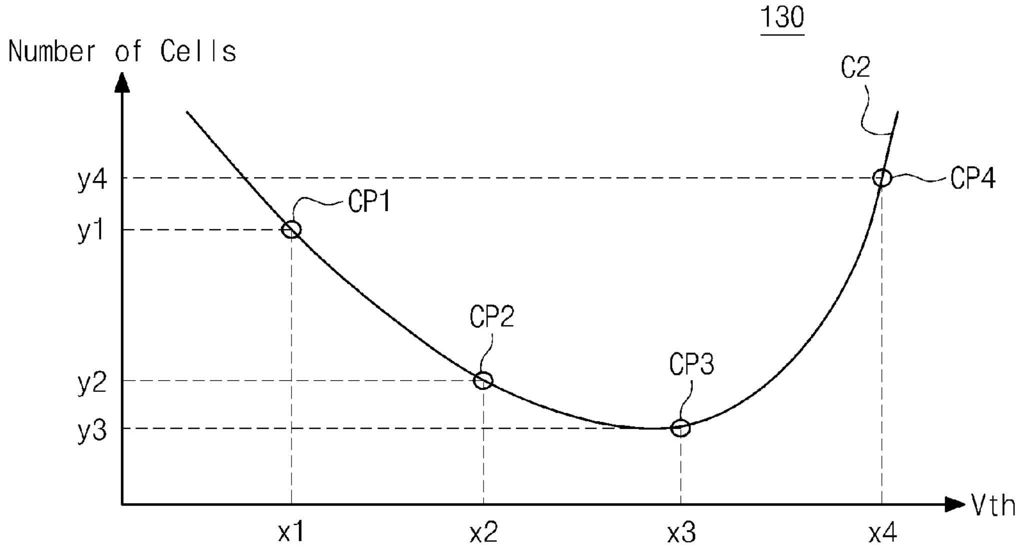
FIG. 6A shows an example coordinate points on a curve at a distribution valley.
Figure 6B:
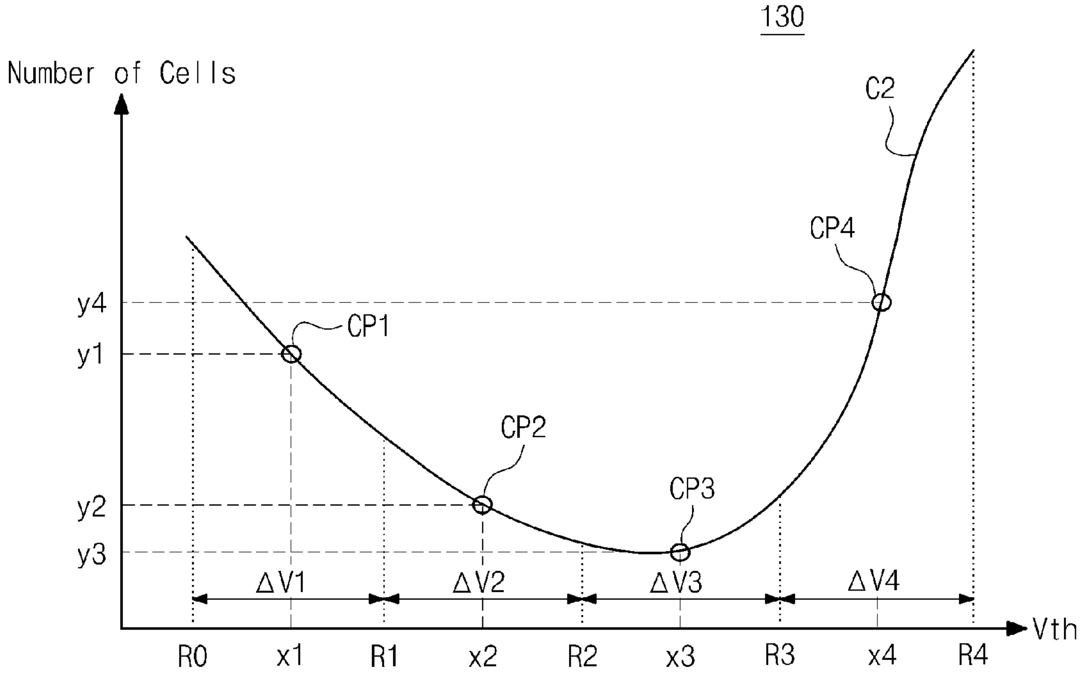
FIG. 6B shows an example read method for obtaining coordinate values on a curve.

FIGS. 6A and 6B are graphs illustrating an example distribution valley form modeled by a cubic function. FIG. 6A shows coordinate points on a curve C2 at a distribution valley 130. FIG. 6B shows an example read method for obtaining coordinate values on a curve C2.

Referring to FIG. 6A, a distribution valley of a probability density function of memory cells to threshold voltages may be modeled by a cubic function such as the curve C2. A function corresponding to the curve C2 may be illustrated as a cubic function where inflection points exist. Memory cells included in an erase state E0 may be distributed in a wide voltage range. Memory cells included in a program state P1 may be managed to have a narrower voltage range according to a program manner such as an incremental step pulse programming (ISPP) manner. A distribution valley 130 between the erase state E0 and the program state P1 may be modeled by a cubic curve.

A minimum point of the curve C2 corresponding to a distribution valley may be obtained by solving the cubic simultaneous equations. Coordinate values of at least four coordinate points CP1, CP2, CP3, and CP4 may be required to gain coefficients of a cubic function corresponding to the curve C2 corresponding to the distribution valley. Although the four coordinate points CP1, CP2, CP3, and CP4 are different coordinate points, there may be no problem to gain a solution of the biquadratic simultaneous equations.

As illustrated in FIG. 6A, the coordinate points may correspond to CP1 (x1, y1), CP2 (x2, y2), CP3 (x3, y3), CP4 (x4, y4), respectively. The following equation 5 may show simultaneous equations for obtaining coefficients of a cubic function ($y=a_0+a_1x+a_2x^2+a_3x^3$).

$$\begin{bmatrix} y_1 \\ y_2 \\ y_3 \\ y_4 \end{bmatrix} = \begin{bmatrix} 1 & x_1 & x_1^2 & x_1^3 \\ 1 & x_2 & x_2^2 & x_2^3 \\ 1 & x_3 & x_3^2 & x_3^3 \\ 1 & x_4 & x_4^2 & x_4^3 \end{bmatrix} \begin{bmatrix} a_0 \\ a_1 \\ a_2 \\ a_3 \end{bmatrix} + \begin{bmatrix} \varepsilon_1 \\ \varepsilon_2 \\ \varepsilon_3 \\ \varepsilon_4 \end{bmatrix} \quad \text{[Equation 5]}$$

In the equation 5, $\epsilon_1$, $\epsilon_2$, $\epsilon_3$, and $\epsilon_4$, may be considered to be DC offsets or errors corresponding to coordinate points, respectively. However, they may be terms to be deleted by differentiation of a function for searching a minimum value.

The coefficients $a_0$, $a_1$, $a_2$, and $a_3$ of a cubic function of the curve C2 corresponding to the distribution valley 130 may be obtained by substituting the coordinate values at the equation 5 to solve the simultaneous equations. Afterwards, the following equation 6 may show such a root $x_{opt}$ that a value obtained by differentiating a cubic function having the coefficients $a_0$, $a_1$, $a_2$, and $a_3$ is '0'

$$x_{opt} = \frac{-a_2 \pm \sqrt{a_2^2 - 3a_3a_1}}{3a_3} \quad \text{[Equation 6]}$$

Herein, if the coefficient $a_3$ is a positive number, then such a solution that a differential value of a cubic function is '1' may include two real roots. A value corresponding to a relative minimum point of the two real roots may be a required value. Thus, in the equation 6, a relatively large value of the two real roots may be an optimal read voltage $x_{opt}$. If the coefficient a3 is a negative number, then a relatively small value of the two real roots may be an optimal read voltage $x_{opt}$. In this case, the following equation 7 shows an example optimal read voltage $x_{opt}$.

$$x_{opt} = \frac{-a_2 + \sqrt{a_2^2 - 3a_3a_1}}{3a_3} \quad \text{[Equation 7]}$$

FIG. 6B is a graph illustrating an example method of obtaining coordinate points of a curve C2 of FIG. 6A.

Referring to FIG. 6B, four coordinate points may be acquired to conduct the regression analysis on a curve C2 by a cubic function. That is, at least five read operations on memory cells may be previously performed to do the regression analysis by a cubic function. Read voltages Ri (0≤i≤4) provided at the read operations may be different from one another.

Read operations using read voltages R0 and R1 may be performed to obtain a coordinate point CP1 (x1, y1). Data D0 may be read from selected memory cells using the read voltage R0, and data D1 may be read from selected memory cells using the read voltage R1. If the number of logic '1' is counted by performing an XOR operation with respect to the data D0 and data D1, the number of memory cells between the read voltages R0 and R1 (e.g., in a voltage band ΔV1) may be obtained. At this time, a coordinate value x1 of a coordinate point CP1 may be mapped with a median of the read voltages R0 and R1. That is, the coordinate value x1 may be mapped with (R0+R1)/2. A coordinate value y1 of the coordinate point CP1 may be mapped with the number of memory cells having threshold voltages belonging to the voltage band ΔV1.

Read operations using read voltages R1 and R2 may be performed to obtain a coordinate point CP1 (x2, y2). If an XOR operation is performed with respect to data D1 read by the read voltage R1 and data D2 read by the read voltage R2, then the number of memory cells corresponding to a voltage band ΔV2 may be obtained. A coordinate value y2 of the coordinate point CP2 may be mapped with the number of memory cells corresponding to the voltage band ΔV2. A coordinate value x2 of the coordinate point CP2 may be mapped with a median of the read voltages R1 and R2. That is, the coordinate value x2 may be mapped with (R1+R2)/2.

Read operations using read voltages R2 and R3 may be performed to obtain a coordinate point CP1 (x3, y3). If an XOR operation is performed with respect to data D2 read by the read voltage R2 and data D3 read by the read voltage R3, the number of memory cells corresponding to a voltage band ΔV3 may be obtained. A coordinate value y3 of the coordinate point CP3 may be mapped with the number of memory cells corresponding to the voltage band ΔV3. A coordinate value x3 of the coordinate point CP3 may be mapped with a median of the read voltages R2 and R3. That is, the coordinate value x3 may be mapped with (R2+R3)/2.

Read operations using read voltages R3 and R4 may be performed to obtain a coordinate point CP1 (x4, y4). If an XOR operation is performed with respect to data D3 read by the read voltage R3 and data D4 read by the read voltage R4, then the number of memory cells corresponding to a voltage band ΔV4 may be obtained. A coordinate value y4 of the coordinate point CP4 may be mapped with the number of memory cells corresponding to the voltage band ΔV4. A coordinate value x4 of the coordinate point CP4 may be mapped with a median of the read voltages R3 and R4. That is, the coordinate value x4 may be mapped with (R3+R4)/2.

Herein, the voltage band ΔV1 corresponding to an interval between the read voltage R0 and the read voltage R1, the voltage band ΔV2 corresponding to an interval between the read voltage R1 and the read voltage R2, the voltage band ΔV3 corresponding to an interval between the read voltage R2 and the read voltage R3, and the voltage band ΔV4 corresponding to an interval between the read voltage R3 and the read voltage R4 may be set to have the same value or different values. If the voltage bands ΔV1, ΔV2, ΔV3, and ΔV4 have the same or substantially the same width, then there may be provided read voltages sequentially increasing by a constant voltage interval from the read voltage R0. Thus, it is easier to generate the read voltages. If the read voltages R1, R2, R3, and R4 are generated using a read voltage R0, then increments ΔV1, ΔV2, ΔV3, and ΔV4 may be set to have the same value.

There is described an example in which a probability density function corresponding to a distribution valley is modeled by a curve C2 corresponding to a cubic function and coordinate values CP1, CP2, CP3, and CP4 may be obtained to apply the regression analysis. If the three coordinate values are gained, then a threshold voltage corresponding to a minimum value of a cubic function may be decided as an optimal read voltage by applying the regression analysis.

Figure 7:
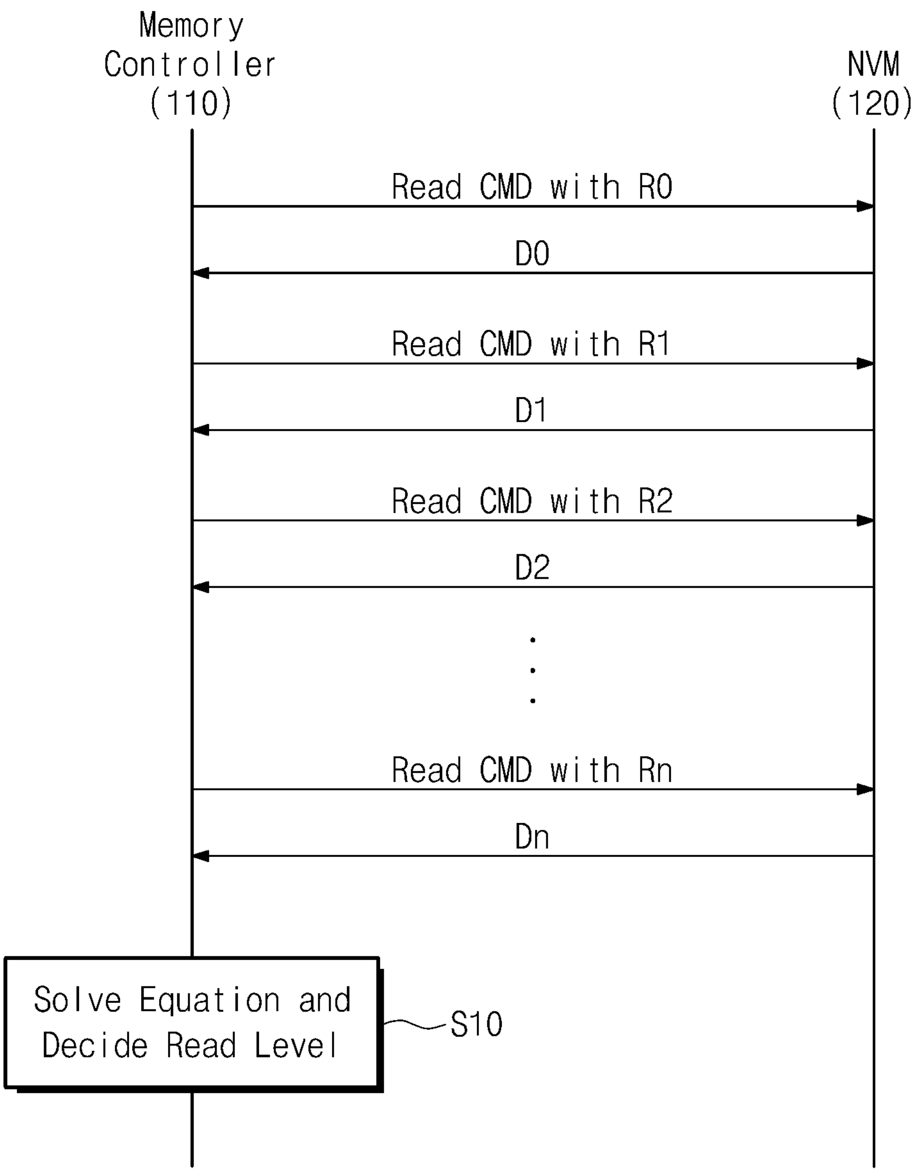
FIG. 7 is a diagram illustrating example operation of a memory system according to an example embodiment of inventive concepts.

FIG. 7 is a diagram illustrating an operation of a memory system according to an example embodiment of inventive concepts. Referring to FIG. 7, a memory controller 110 and a nonvolatile memory device 120 may exchange read commands corresponding to read voltages for obtaining coordinate values and data corresponding to the read commands.

The memory controller 110 may provide the nonvolatile memory device 120 with a read command for obtaining a coordinate point of a probability density function corresponding to a distribution valley. At this time, to apply the regression analysis, the memory controller 110 may provide a command such that selected memory cells are read using a read voltage R0. The nonvolatile memory device 120 may sense the selected memory cells using the read voltage R0. The nonvolatile memory device 120 may output data D0 sensed using the read voltage R0 to the memory controller 110.

The memory controller 110 may provide a command such that selected memory cells are read using a read voltage R1. The nonvolatile memory device 120 may sense the selected memory cells using the read voltage R1. The nonvolatile memory device 120 may output data D1 sensed using the read voltage R1 to the memory controller 110.

The memory controller 110 may be provided with read data D0 to Dn−1 sensed from the selected memory cells using the read voltages R0 to Rn−1 in the same or substantially the same manner as described above. If the read operations are completed, then the memory controller 110 may obtain a probability density function corresponding to a distribution valley to calculate a minimum value of the probability density function. In block 810, a threshold voltage corresponding to the minimum value may be decided as a read voltage for discriminating two states.

Figure 8:
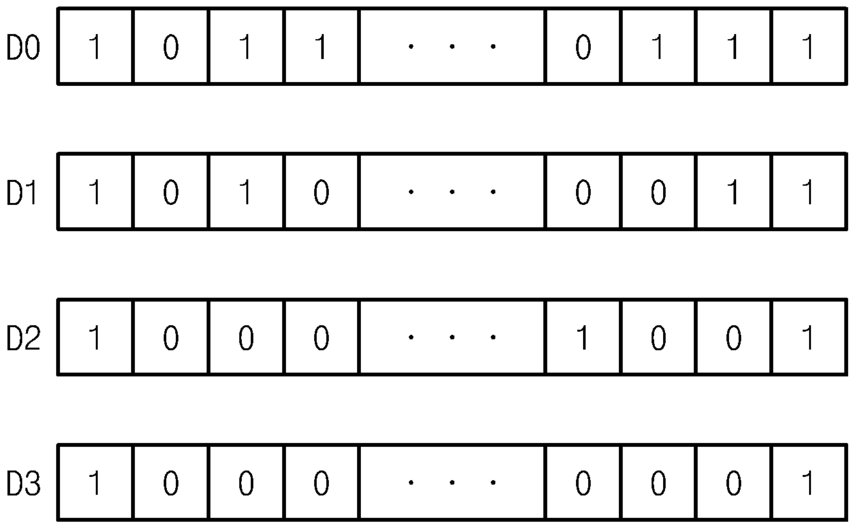
FIG. 8 is a diagram illustrating example data provided from a nonvolatile memory device.

FIG. 8 is a diagram illustrating example data provided from a nonvolatile memory device. Referring to FIG. 8, there may be illustrated data D0 to D3 sensed from selected memory cells of a nonvolatile memory device using read voltages R0 to R3.

The nonvolatile memory device 120 may output data D0 read using the read voltage R0 in response to a command of a memory controller 110. The nonvolatile memory device 120 may output data D1 read using the read voltage R1 in response to a command of the memory controller 110. The nonvolatile memory device 120 may output data D2 read using the read voltage R2 in response to a command of the memory controller 110. The nonvolatile memory device 120 may output data D3 read using the read voltage R3 in response to a command of the memory controller 110.

If the data D0, D1, D2, and D3 read using different levels of read voltages are output, then a bit counter 112 of the memory controller 110 may perform an XOR operation. The XOR operation on the data D0, D1, D2, and D3 may be performed by a column unit. The bit counter 112 may count the number of logic '1' included in a result of the XOR operation on the data D0 and D1. At this time, the count value may be decided as a coordinate value y1, and a median (or, an average) of the read voltages R0 and R1 may be decided as a coordinate value x1.

Coordinate value x2 and y2 may be obtained through an XOR operation on the data D1 and D2 in the above-described manner. Likewise, coordinate value x3 and y3 may be obtained through an XOR operation on the data D2 and D3. If coordinate values of three coordinate points are decided, information for applying the regression analysis of a distribution valley function modeled by a quadratic function may be gained.

Figure 9:
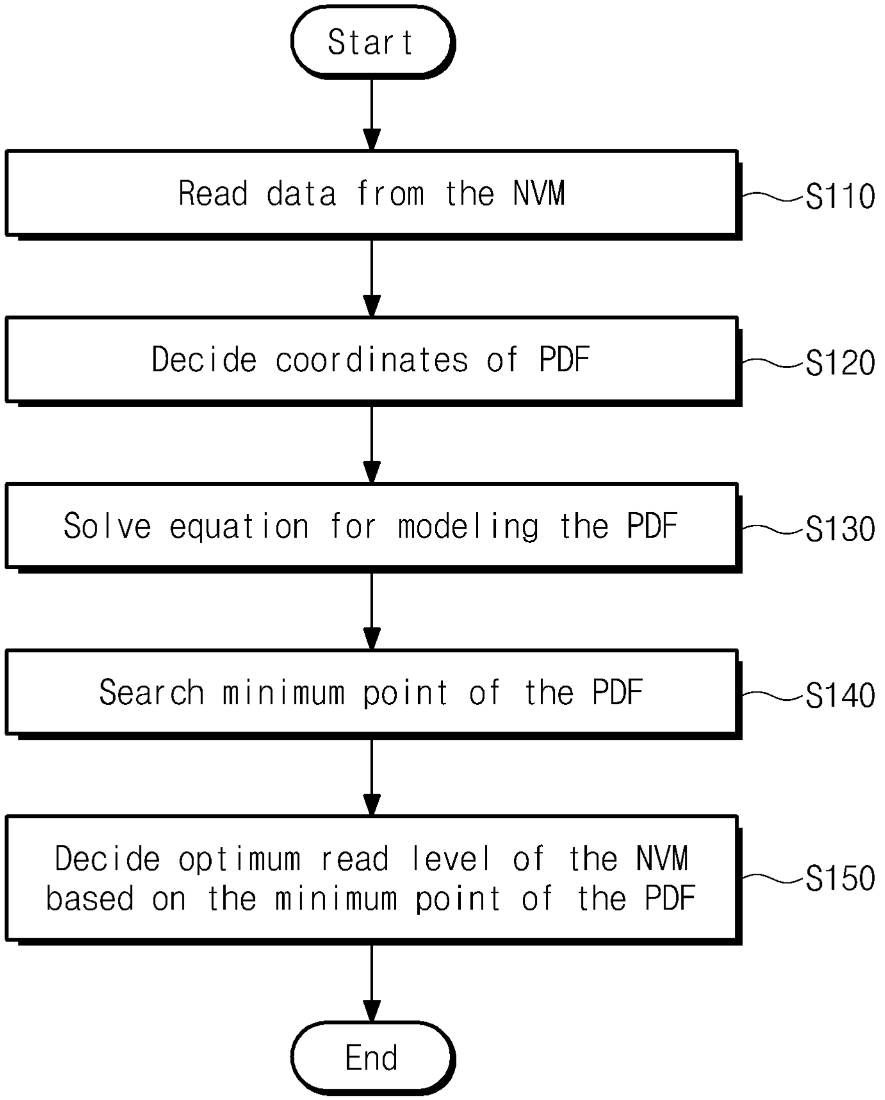
FIG. 9 is a flow chart schematically illustrating a read level deciding method according to an example embodiment of inventive concepts.

FIG. 9 is a flow chart schematically illustrating a read level deciding method according to an example embodiment of inventive concepts. Below, a method of deciding an optimal read voltage from a modeled probability density function of a distribution valley will be more fully described with reference to FIGS. 1 and 9.

In operation S110, the memory controller 110 may provide a nonvolatile memory device with a read command including level information of read voltages R0 to Rn−1. The nonvolatile memory device 120 may read data from selected memory cells using the read voltages R0 to Rn−1 to output the read data D0 to Dn−1 to the memory controller 110.

In operation S120, the memory controller 110 may calculate coordinate values based on the input data D0 to Dn−1. For example, the memory controller 110 may count the number of memory cells having threshold voltages between read voltages. The memory controller 110 may decide coordinate values of at least three coordinate points based on the count result.

In operation S130, a regression analyzer 114 of the memory controller 110 may obtain a probability density function corresponding to distribution valley based on the coordinate values. That is, the regression analyzer 114 may obtain coefficients of the probability density function based on the coordinate values. The regression analyzer 114 may use the quadratic simultaneous equations or the cubic simultaneous equations to obtain the probability density function.

In operation S140, the regression analyzer 114 may obtain a threshold voltage level corresponding to a minimum value from the probability density function. For example, in the case that the probability density function is modeled by a quadratic function, an optimal read voltage $V_{opt}$ may be decided to obtaining a threshold voltage level corresponding to a minimum value. In the case that the probability density function is modeled by a cubic function, such a root that a differential value of the probability density function is '0' may include two real roots in maximum. That is, one of the two real roots may correspond to a maximum value, and the other thereof may correspond to a minimum value.

In operation S150, the memory controller 110 may select one of such threshold voltages that a differential value of the probability density function corresponding to the distribution valley is '0', as an optimal read voltage. If the probability density function is modeled by a quadratic function, then such a root that a differential value of the probability density function is '0' may include only one root. If the probability density function is modeled by a cubic function, then such a root that a differential value of the probability density function is '0' may include two real roots in maximum. A distribution valley form between an erase state E0 and a program state P1 may be similar or substantially similar to a curve form around a minimum value of a cubic function (if a3>0). Thus, it is reasonable to select one, corresponding to a minimum value, from among two real roots as an optimal read voltage. In other words, one, corresponding to a relatively large value, from among two real roots may be selected as an optimal read voltage $V_{opt}$.

There is schematically described the regression analysis used to adjust a read voltage of the nonvolatile memory device 120. Coordinate values of a modeled probability density function may be required to execute the regression analysis. If the probability density function is modeled by a quadratic function, then at least three coordinate values may be required. Thus, at least four read operations using different levels of read voltages may be required to obtain three coordinate values. If the probability density function is modeled by a cubic function, then at least four coordinate values may be required. Thus, at least five read operations using different levels of read voltages may be required to obtain four coordinate values.

With the above-described regression analysis, a probability density function of a distribution valley may be modeled through reduced and/or minimum read operations. A threshold voltage corresponding to a minimum value of the modeled probability density function may be decided as a read voltage. Since the read voltage adjusting manner accompanies minimum read operations, the performance may be improved. In addition, since a probability density function is modeled to be approximate to a distribution valley, it is possible to detect a minimum value more accurately. Thus, as a read voltage adjusted through the regression analysis is used, higher data integrity may be expected.

Figure 10:
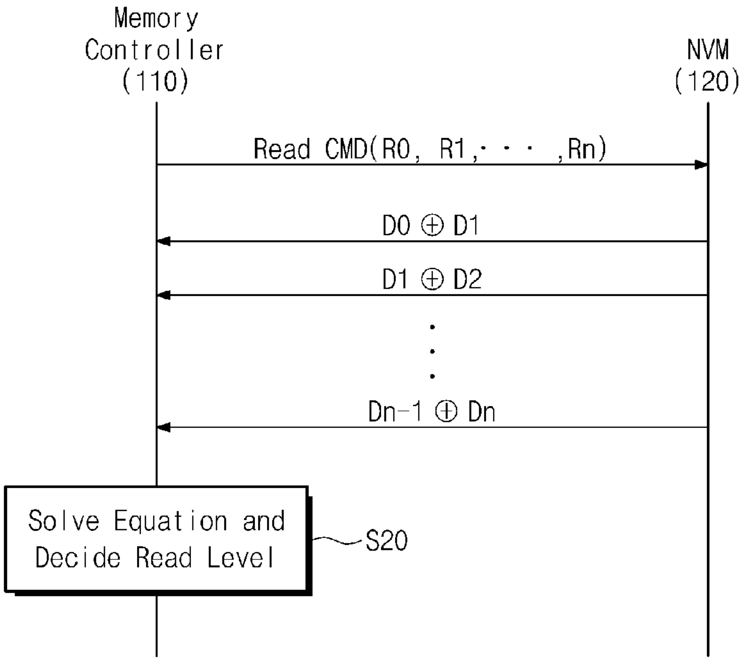
FIG. 10 is a diagram schematically illustrating a read method of a memory system according to another example embodiment of inventive concepts.

FIG. 10 is a diagram schematically illustrating a read method of a memory system according to another example embodiment of inventive concepts. Referring to FIG. 10, a nonvolatile memory device 120 (refer to FIG. 1) may output a result of an XOR operation on sensed data in response to a read command of a memory controller 110 (refer to FIG. 1).

To apply the regression analysis, a memory controller 110 may provide the nonvolatile memory device 120 with a read command including read level information. The memory controller 110 may transfer plural read voltage information to the nonvolatile memory device 120 in a read command step, not to require data corresponding to a read voltage. That is, the memory controller 110 may designate a plurality of read voltages R1 to Rn in the read command step.

The nonvolatile memory device 120 may sense selected memory cells sequentially in response to the read command of the memory controller 110. The nonvolatile memory device 120 may sense the selected memory cells with a read voltage R0 being applied to a word line of the selected memory cells. Data D0 sensed using the read voltage R0 may be stored at latches of a page buffer circuit 123 (refer to FIG. 2). Data D1 sensed using the read voltage R1 may be stored at latches of the page buffer circuit 123. The nonvolatile memory device 120 may perform an XOR operation on the data D0 and D1 sensed using different read voltages. The nonvolatile memory device 120 may output a result of the XOR operation to the memory controller 110.

The nonvolatile memory device 120 may sense the selected memory cells sequentially using the read voltages R0 to Rn to latch sensed data. The sensing and latching operations may be performed to overlap with the XOR operation and a result an output operation. If data sensed using a plurality of read voltages is sequentially stored at latches the size of which corresponds to two pages, then an XOR operation on stored data may be performed by a column unit. A result of the XOR operation may be output to an external device through an input/output buffer circuit 124. That is, a result of an XOR operation on data D0 and D1 corresponding to the read voltages R1 and R2 may be output. Then, a result of an XOR operation on data D2 and D3 corresponding to the read voltages R2 and R3 may be output. If four read levels are designated, a result of an XOR operation may be output to the memory controller 110 three times by a read unit (e.g., a page).

The memory controller 110 may receive results of XOR operations on data D0 to Dn. The memory controller 110 may count the number of memory cells distributed between read voltages, based on each of the results of XOR operations. That is, a bit counter 112 of the memory controller 110 may count the number of logic '1' included in a result of an XOR operation. If the counting operation is ended, then coordinate values of each of coordinate points may be decided. The memory controller 110 may obtain a probability density function corresponding to a distribution valley form based on the decided coordinate values. A regression analyzer 114 of the memory controller 110 may obtain a minimum value of the probability density function, and may decide a threshold voltage level corresponding to the minimum value as a new read voltage. This procedure may be performed in block S20.

Herein, in operation where a read command is provided, information indicating a difference between a read voltage R0 for a first read operation and read voltages to be provided later may be provided. That is, offset information between the read voltage R0 for the first read operation and read voltages to be provided sequentially may be further provided. The nonvolatile memory device 120 may generate read voltages sequentially based on the offset information, and may sense selected memory cells using the read voltages.

In the case that a result of an XOR operation on continuously read data is output, the burden of the memory controller 110 may be reduced. Also, compared with the case that read data is output, the number of data output operations of the nonvolatile memory device 120 may be reduced.

Figure 11:
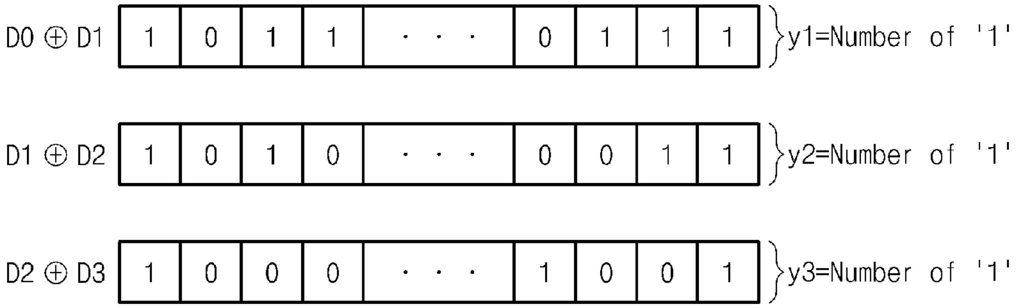
FIG. 11 is a diagram schematically illustrating an example result of an XOR operation of FIG. 10.

FIG. 11 is a diagram schematically illustrating an example result of an XOR operation of FIG. 10. Referring to FIG. 11, a nonvolatile memory device 120 may perform an XOR operation on data sensed using two read levels according to a command of a memory controller 120, and may output a result of the XOR operation.

The nonvolatile memory device 120 may sense selected memory cells based on a read voltage provided from the memory controller 110. The nonvolatile memory device 120 may store data D0 read using a read voltage R0 at a first latch unit. Then, the nonvolatile memory device 120 may store data D1 read using a read voltage R1 at a second latch unit. Herein, the first and second latch units may be formed of latches in a page buffer circuit 123. It is assumed that data is read by a page unit using a read level. If an XOR operation on the data D0 and D1 stored at the first and second latch units is performed by a column unit, then a result of the XOR operation may have a page size. If a result of an XOR operation is transferred to the memory controller 110, then a bit counter 112 may count the number of logic '1' included in the input result of the XOR operation. The count value indicating the number of logic '1' included in the input result of the XOR operation may be mapped with a coordinate value y1. A coordinate value x1 may be mapped with an average of the read voltages R0 and R1.

The nonvolatile memory device 120 process data D1 read using the read voltage R1 and data D2 read using the read voltage R2 to output a processed result to the memory controller 110. The bit counter 112 may count the number of logic '1', and the count value may be mapped with a coordinate value y2. A coordinate value x2 may be mapped with an average of the read voltages R1 and R2. The nonvolatile memory device 120 process data D2 read using the read voltage R2 and data D3 read using the read voltage R3 to output a processed result to the memory controller 110. The memory controller 110 may decide a coordinate value y3.

With the above description, the number of transactions between the memory controller 110 and the nonvolatile memory device 120 may be reduced. Thus, the performance may be improved in comparison with the case that data is transferred to the memory controller 110 without an XOR operation.

Figure 12:
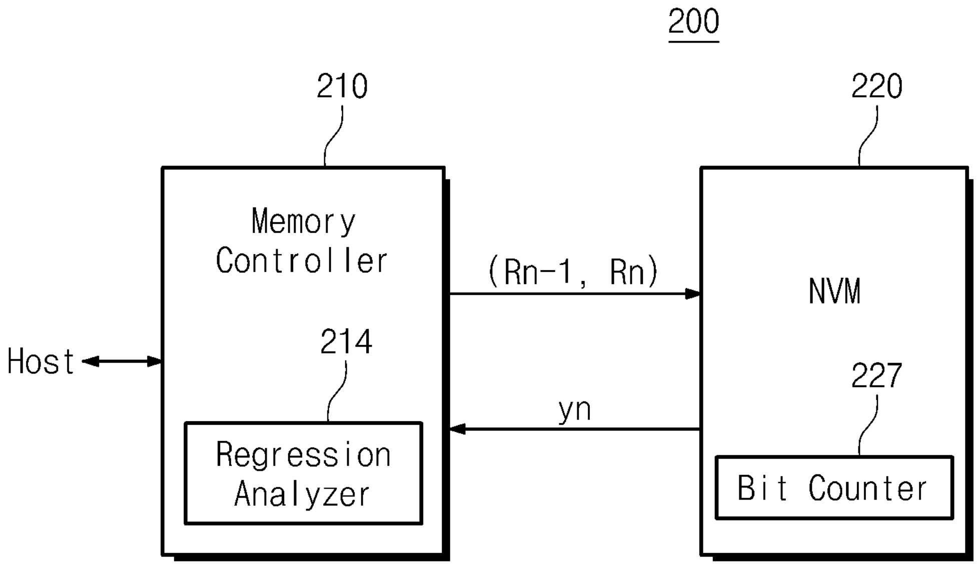
FIG. 12 is a block diagram schematically illustrating a memory system according to another example embodiment of inventive concepts.

FIG. 12 is a block diagram schematically illustrating a memory system according to another example embodiment of inventive concepts. Referring to FIG. 12, a memory system 200 may include a memory controller 210 and a nonvolatile memory device 220. The memory controller 210 may conduct the regression analysis based on a read result provided from the nonvolatile memory device 220 to decide an optimal read voltage.

If adjustment of a read level is required, the memory controller 210 may provide the nonvolatile memory device 220 with a read command including information of read voltages Rn−1 and Rn. For example, the memory controller 210 may provide a read command for sensing selected memory cells using different levels of read voltages Rn−1 and Rn. The nonvolatile memory device 220 may perform an XOR operation on data Dn−1 and Dn sensed using the read voltages Rn−1 and Rn in response to the read command. The nonvolatile memory device 220 may count the number of logic '1' included in a result of the XOR operation. This count operation may be performed by a bit counter 227 included in the nonvolatile memory device 220. The nonvolatile memory device 220 may output the count value as a coordinate value yn corresponding to an average of the read voltages Rn−1 and Rn.

The memory controller 210 may request the coordinate value yn provided from the nonvolatile memory device 220 as needed. For example, if at least three different coordinate values are required, then a command for counting the number of memory cells included in different threshold voltage bands may be provided three times. The memory controller 210 may obtain a probability density function corresponding to a distribution valley based on coordinate values output according to respective commands. An operation in which an optimal read voltage is decided using a minimum value obtained from a probability density function may be performed by a regression analyzer 214.

With the above description, the memory controller 210 may acquire a coordinate value yn directly from the nonvolatile memory device 220. Thus, the burden of the memory controller 210 may be reduced. The memory controller 210 may decide an optimal read voltage through reduced and/or minimum access on the nonvolatile memory device 220 using the regression analysis. Thus, there may be reduced and/or minimized time taken to adjust a level of a read voltage.

Figure 13:
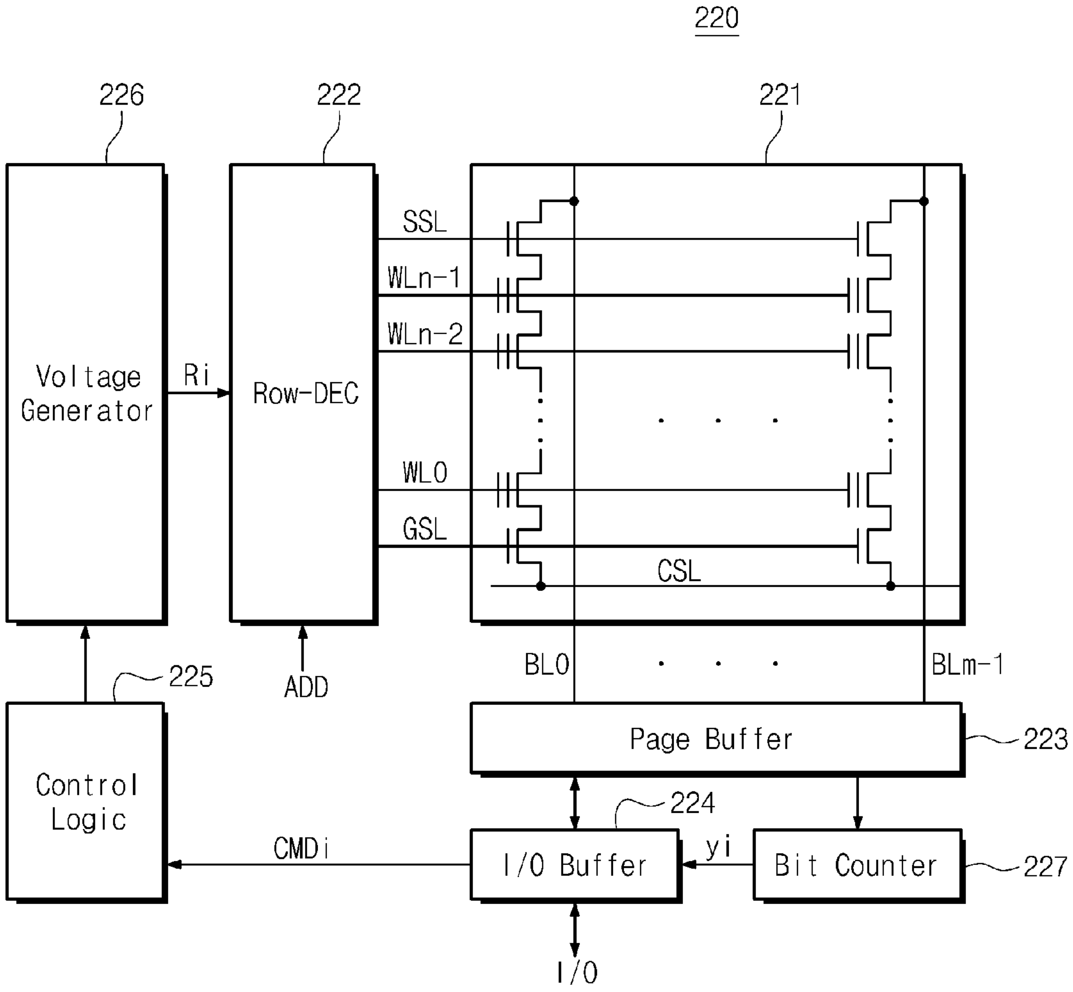
FIG. 13 is a block diagram schematically illustrating an example embodiment of a nonvolatile memory device of FIG. 12.

FIG. 13 is a block diagram schematically illustrating an example nonvolatile memory device of FIG. 12. Referring to FIG. 13, a nonvolatile memory device 220 may include a cell array 221, a row decoder 222, a page buffer circuit 223, an input/output buffer circuit 224, control logic 225, a voltage generator 226, and a bit counter 227. The nonvolatile memory device 220 of FIG. 13 may be substantially the same as that of FIG. 2 except that the bit counter 227 is added. Thus, a description of the components 221 to 226 is omitted.

A memory controller 210 may control the nonvolatile memory device 220 such that selected memory cells are read two times using two read voltages and a coordinate value is output. If a command is received from the memory controller 210, then the nonvolatile memory device 220 may read data from the selected memory cells using at least two read voltages Ri−1 and Ri. The read data may be stored sequentially at the page buffer circuit 223. The bit counter 227 may perform an XOR operation on two pages of data stored at the page buffer circuit 223. The bit counter 227 may count the number of logic '1' included in a result of the XOR operation. The count result yi of the bit counter 227 may be output to the memory controller 210 through the input/output buffer circuit 224.

In example embodiments, the bit counter 227 may include latch units (or, registers) for storing two pages of data and a logic gate string for executing the XOR operation. For example, the bit counter 227 may store two pages of data read using different read voltages at the latch units. The bit counter 227 may include a logic gate string for executing an XOR operation on bits in the same column. In addition, the bit counter 227 may include a counter circuit (not shown) to count the number of logic '1' included in a page of data output from the logic gate string. An output of the counter circuit may correspond to a coordinate value yi of a corresponding read level.

Figure 14:
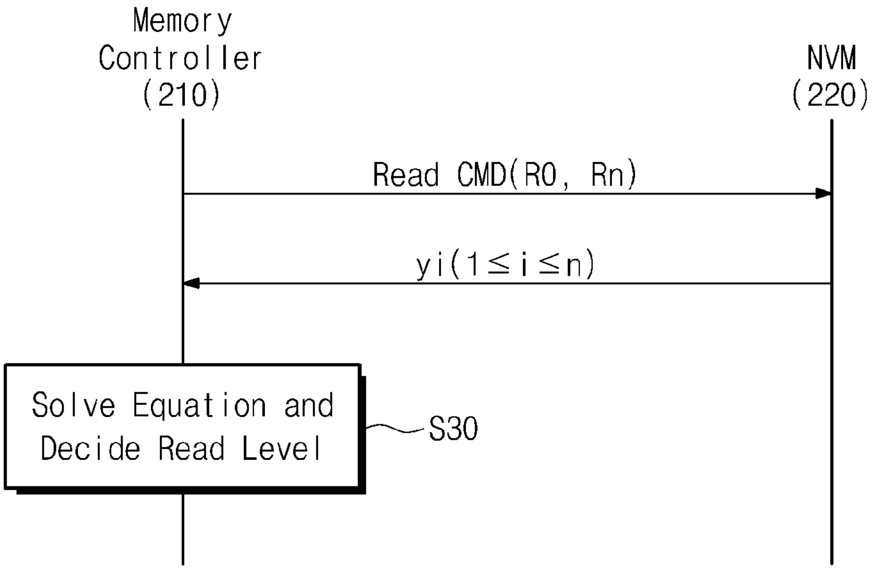
FIG. 14 is a diagram schematically illustrating a read method of a memory system of FIG. 12 according to still another example embodiment of inventive concepts.

FIG. 14 is a diagram schematically illustrating a read method of a memory system of FIG. 12 according to still another example embodiment of inventive concepts. Referring to FIG. 14, in response to a read command of a memory controller 210 (refer to FIG. 12), a nonvolatile memory device 220 (refer to FIG. 12) may provide a plurality of coordinate values yi (1≤i≤n).

When the memory controller 210 provides a read command for adjusting a read level to the nonvolatile memory device 220, it may designate all read voltages R0 to Rn. In FIG. 14, (R0, Rn) may mean all read voltages from a read voltage R0 to a read voltage Rn.

In response to a read command of the memory controller 210, the nonvolatile memory device 220 may sense selected memory cells sequentially. The nonvolatile memory device 220 may sense the selected memory cells with the read voltage R0 being applied to a word line of the selected memory cells. Data D0 sensed using the read voltage R0 may be stored at latches in a page buffer circuit 223 (refer to FIG. 13). The nonvolatile memory device 220 may sense the selected memory cells with the read voltage R1 being applied to the word line of the selected memory cells. Data D1 sensed using the read voltage R1 may be stored at latches in the page buffer circuit 223. The nonvolatile memory device 220 may sequentially perform read operations on the selected memory cells using the read voltages R0 to Rn. The sensed data may be stored at the page buffer circuit 223 to be sequentially transferred to a bit counter 227.

The bit counter 227 may perform an XOR operation on the data D0 and D1 sensed using different read voltages. The bit counter 227 may count the number of logic '1' included in a result of the XOR operation on the data D0 and D1. The bit counter 227 may store the number of logic '1' included in a result of the XOR operation on the data D0 and D1 as a coordinate value y1.

The bit counter 227 may perform an XOR operation on the data D0 and D1 and a count operation on a result of the XOR operation to obtain and store a coordinate value y2. Operations of the bit counter 227 may be sequentially performed with respect to all read voltages R0 to Rn requested from the memory controller 210. If a probability density function of the selected memory cells is modeled by a quadratic function, then three coordinate values y1 to y3 may be stored. If a probability density function of the selected memory cells is modeled by a cubic function, then four coordinate values y1 to y4 may be stored. The coordinate values y1 to yn stored may be output to the memory controller 210.

The memory controller 210 may calculate coefficients of the probability density function by doing the regression analysis based on the coordinate values y1 to yn. The memory controller 210 may calculate a minimum value of the probability density function, and may decide a threshold voltage corresponding to the minimum value as a read voltage. This procedure may be executed in block S30.

Figure 15:
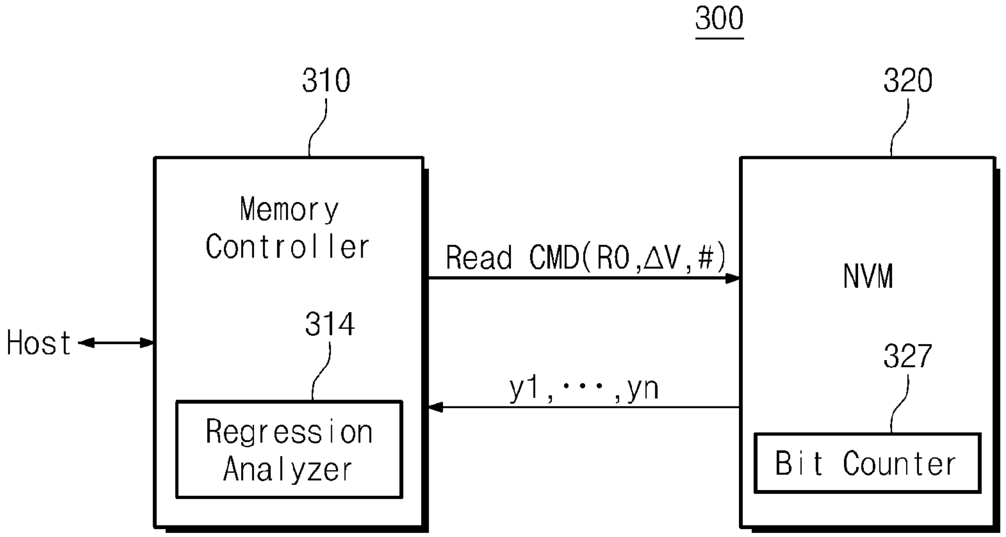
FIG. 15 is a block diagram schematically illustrating a memory system according to still another example embodiment of inventive concepts.

FIG. 15 is a block diagram schematically illustrating a memory system according to still another example embodiment of inventive concepts. Referring to FIG. 15, a memory system 300 may include a memory controller 310 and a nonvolatile memory device 320.

The memory controller 310 may provide the nonvolatile memory device 320 with a read command for the regression analysis. The read command from the memory controller 310 may include read voltage information (R0, ΔV, #). Herein, "R0" may indicate a first read level. "ΔV" may indicate an interval between read voltages, and "#" may indicate a frequency by which the first read voltage R0 sequentially increases by the interval ΔV. That is, "#" may correspond to a read frequency.

In response to the read command for the regression analysis of the memory controller 310, the nonvolatile memory device 320 may output coordinate values y1 to yn. The memory controller 310 may calculate a probability density function corresponding to a distribution valley based on the coordinate values y1 to yn. That is, a regression analyzer 314 may obtain coefficients of the probability density function using the coordinate values y1 to yn. The regression analyzer 314 may calculate a minimum value of the probability density function, and may decide a threshold voltage level corresponding to the minimum value as an optimal read voltage.

The nonvolatile memory device 320 may sense selected memory cells using a first read voltage R0 in response to the read command. The nonvolatile memory device 320 may sequentially perform read operations on the selected memory cells using read voltages sequentially increasing from the first read voltage R0 by the voltage interval ΔV. The read voltages may be provided read frequency # times after the first read voltage R0 is provided.

Data sensed using the read voltages may be provided to a bit counter 327. The bit counter 327 may perform an XOR operation on data Dn−1 and Dn sensed using different levels of read voltages Rn−1 and Rn. The bit counter 327 may count the number of logic '1' included in a result of the XOR operation. The bit counter 327 may output the count value as a coordinate value yn. The coordinate value may be calculated with respect to all read voltages designated, and calculated coordinate values y1 to yn may be gathered and output to the memory controller 310.

The memory controller 310 may request the coordinate value yi provided from the nonvolatile memory device 320 as needed. For example, if at least three coordinate values are required, then the memory controller 310 may have a read frequency # having a value of 3. If at least four coordinate values are required, then the memory controller 310 may have a read frequency # having a value of 4. It is possible to reduce the voltage interval ΔV and increase a read frequency # for improvement of the degree of accuracy.

If the nonvolatile memory device 320 is used, then the memory controller 310 may reduce and/or minimize the number of transactions required to adjust a read level. In example embodiments, it is possible to acquire coordinate value information needed for the regression analysis using a read command and a data output operation.

Figure 16:
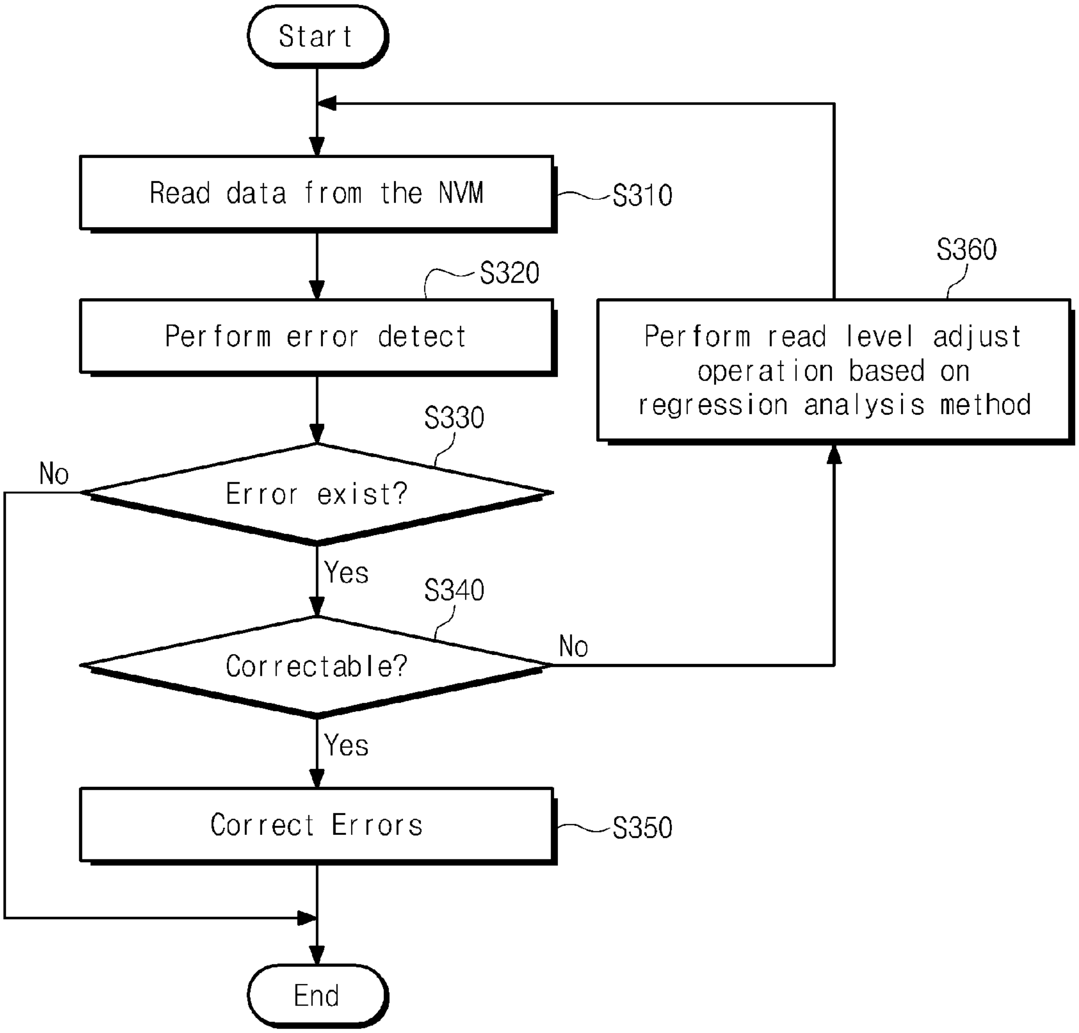
FIG. 16 is a flow chart illustrating a read method according to still another example embodiment of inventive concepts.

FIG. 16 is a flow chart illustrating a read method according to still another example embodiment of inventive concepts. Referring to FIG. 16, if read fail is generated at a read operation of a nonvolatile memory device 320, then a read voltage adjusting operation according to example embodiments of inventive concepts may be executed.

In operation S310, a memory controller 310 may read data from the nonvolatile memory device 320 in response to a host request. The nonvolatile memory device 320 may read data from selected memory cells using a read voltage not adjusted.

In operation S320, the memory controller 310 may perform an error detection operation on the read data. The error detection operation may be an operation in which whether an error exists is determined based on an error correction code in the read data or the number of erroneous bits is detected.

In operation S330, the memory controller 310 may determine whether an error exists. If no error exists, then the method may be ended. If an error exists, then the method proceeds to operation 8340.

In operation S340, the memory controller 310 may determine whether the detected error is correctable. For example, the memory controller 310 may determine whether the number of error bits detected exceeds a correction capacity of an error correction engine. If the detected error is correctable, then the method proceeds to operation S350. If the detected error is uncorrectable, then the method proceeds to operation S360.

In operation S350, the memory controller 310 may correct the detected error. For example, the error correction engine of the memory controller 310 may calculate a syndrome, and may calculate locations of erroneous bits based on the syndrome. Afterwards, the error correction operation may be executed by correcting erroneous bits corresponding to the calculated locations.

In operation S360, the memory controller 310 may perform a read voltage adjusting operation on memory cells from which uncorrectable data is read. As described above, a probability density function of memory cells may be obtained through four or five read operations to adjust a level of a read voltage. The regression analysis may be applied to detect a minimum value of the probability density function. If the read voltage is adjusted, then the method proceeds to operation S310, in which the selected memory cells are read using the adjusted read voltage.

There is described a read method of a nonvolatile memory device using the regression analysis. If an uncorrectable error is generated at a read operation, then a read voltage may be optimally adjusted through a read voltage adjusting operation of inventive concepts. Four or five read operations may be needed to detect a minimum point of a probability density function corresponding to a distribution valley. Thus, there may be reduced and/or minimized burden of the memory system when a read voltage is adjusted.

Figure 17:
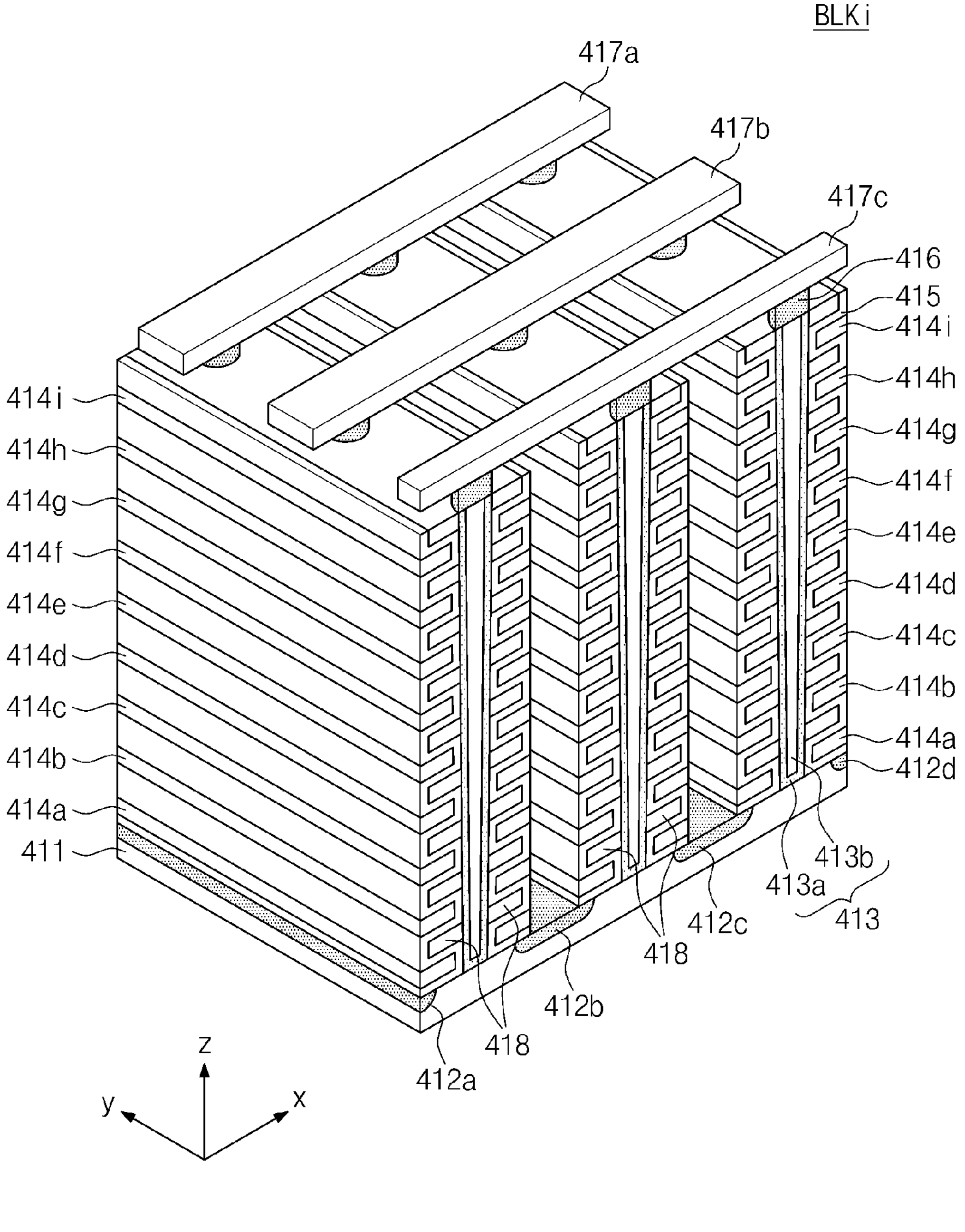
FIG. 17 is a perspective view of a nonvolatile memory device according to an example embodiment of inventive concepts.

FIG. 17 is a perspective view of a nonvolatile memory device according to an example embodiment of inventive concepts. Referring to FIG. 17, a cell array 121/221 may include a plurality of memory blocks, each of which is formed to have a three-dimensional stack structure in which a cell string is formed in a direction (z-direction) perpendicular to a substrate.

A plurality of doping regions 412*a*, 412*b*, 412*c*, and 412*d* extended in an x-axis may be provided on a substrate 411. At a region on the substrate 411 between the first and second doping regions 412*a* and 412*b*, a plurality of insulating materials 418 extending along a y-direction may be sequentially provided along the z-direction. For example, the plurality of insulating materials 418 may be formed to be spaced apart along the z-direction.

On the substrate 411 between the first and second doping regions 412*a* and 412*b*, a plurality of pillars 413 may be provided which are sequentially disposed along the y-direction and pass through the insulating materials 418 along the z-direction. In example embodiments, the pillars 413 may be connected to the substrate 411 through the insulating materials 418, respectively. Herein, the pillars 413 may be formed on the substrate 411 between the second and third doping regions 412*b* and 412*c* and between third and fourth doping regions 412*c* and 412*d*, respectively.

An inner layer 413*b* of each pillar 413 may be formed of an insulating material. For example, the inner layer 413*b* of each pillar 413 may include an insulating material such as silicon oxide. In a region between the first and second doping regions 412a and 412b, an insulation layer 415 may be provided along the exposed surfaces of the substrate 411, the insulating materials 418, and the pillars 413. In example embodiments, there can be removed an insulation layer 415 provided at an exposed surface toward the z-direction of the last insulation material 418.

In the region between the first and second doping regions 412a and 412b, first conductive materials 414a to 414i may be provided onto an exposed surface of the insulation layer 415. For example, the conductive material 414a extending along the y-direction may be provided between the substrate 411 and the insulating material 418 adjacent to the substrate 411. More specifically, the conductive material 414a extending along the x-direction may be provided between the substrate 411 and the insulation layer 415 of the lower surface of the insulating material 418 adjacent to the substrate 411. The same structure as formed on the first and second doping regions 412a and 412b may be provided between the second and third doping regions 412b and 412c. The same structure as formed on the first and second doping regions 412a and 412b may be provided between the third and fourth doping regions 412c and 412d.

Drains 416 may be provided on the pillars 413, respectively. In example embodiments, the drains 416 may be silicon materials that are doped in a second type. Second conductive materials 417a to 417c extending along the x-direction may be provided on the drains 416. The second conductive materials 417a to 417c may be sequentially disposed along the y-direction. The second conductive materials 417a to 417c may be connected to the drains 416 of corresponding regions, respectively. In example embodiments, the drains 416 and the conductive material 417c extending along the x-direction may be connected through contact plugs.

Herein, the first conductive materials 414a to 414i may form word lines or selection lines SSL and GSL. Conductive materials, belonging to the same layer, from among the conductive materials 414b to 414h used as word lines may be interconnected. The memory block BLKi may be selected when the first conductive materials 414a to 414i all are selected. On the other hand, a sub-block of inventive concepts may be selected by selecting a part of the first conductive materials 414a to 414i. The number of the first conductive materials 414a to 414i may not be limited to this disclosure. The number of the first conductive materials 414a to 414i may be changed variously according to a process or control technique.

Figure 18:
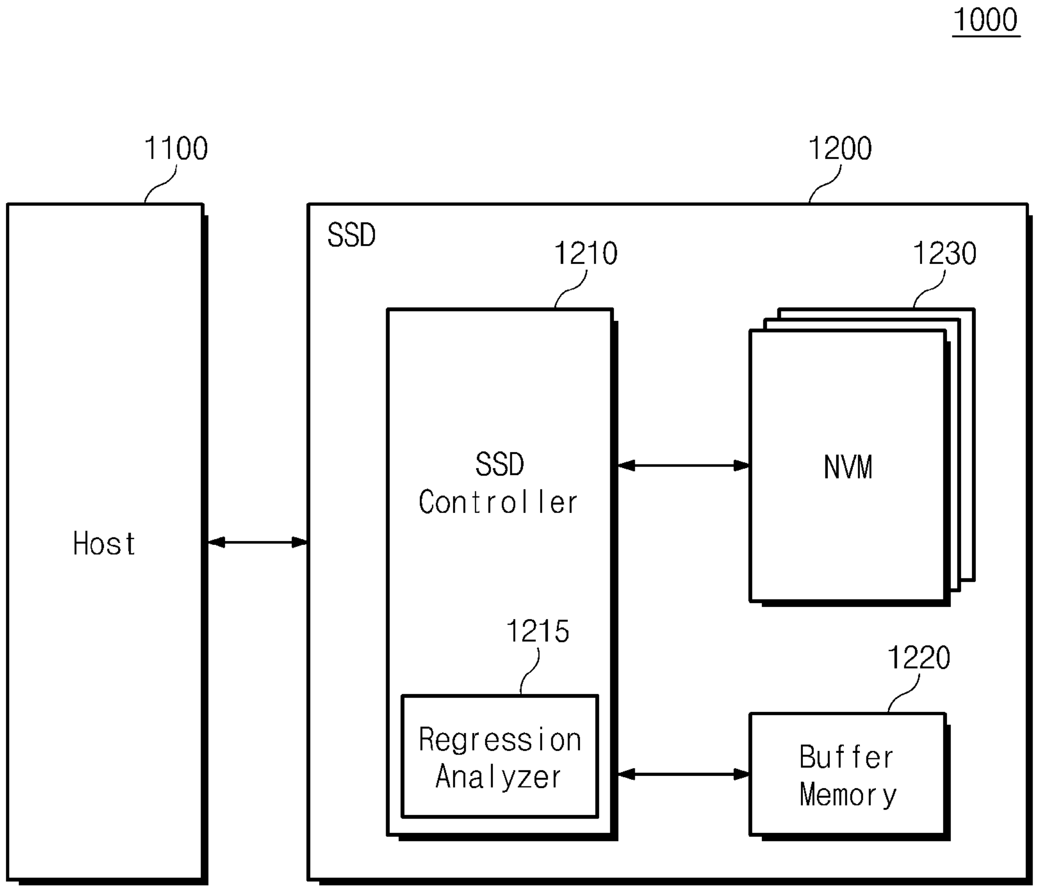
FIG. 18 is a block diagram illustrating a user device including a solid state drive according to an example embodiment of inventive concepts.

FIG. 18 is a block diagram illustrating a user device including a solid state drive according to an example embodiment of inventive concepts. Referring to FIG. 18, a user device 1000 may include a host 1100 and an SSD 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. The SSD controller 1210 may include a regression analyzer 1215. It is possible to detect a more exact location of a distribution valley of memory cells through reduced and/or minimum read operations using the regression analyzer 1215. Thus, it is possible to find an optimal read level through reduced and/or minimum read operations on memory cells when a read operation is failed.

The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 may temporarily store write data provided from the host 1100 or data read out from the nonvolatile memory device 1230. In the event that data existing in the nonvolatile memory device 1230 is cached at a read request of the host 1100, the buffer memory 1220 may support a cache function of providing cached data directly to the host 1100. Typically, a data transfer speed of a bus format (e.g., SATA or SAS) of the host 1100 may be higher than that of a memory channel of the SSD 1200. That is, in the event that an interface speed of the host 1100 is remarkably fast, lowering of the performance due to a speed difference may be reduced and/or minimized by providing the buffer memory 1220 having a larger storage capacity.

The buffer memory 1220 may be formed of a synchronous DRAM to provide sufficient buffering to the SSD 1200 used as an auxiliary mass storage device. However, the buffer memory 1220 is not limited to this example.

The nonvolatile memory device 1230 may be provided as a storage medium of the SSD 1200. For example, the nonvolatile memory device 1230 may be formed of a vertical NAND flash memory device having a mass storage capacity. The nonvolatile memory device 1230 may be formed of a plurality of memory devices. In this case, memory devices may be connected with the SSD controller 1210 by a channel unit. The nonvolatile memory device 1230 is not limited to a NAND flash memory device. For example, a storage medium of the SSD 1200 can be formed of a PRAM, an MRAM, a ReRAM, a FRAM, a NOR flash memory, and so on. Further, inventive concepts may be applied to a memory system which uses different types of memory devices together. The nonvolatile memory device 1230 may be configured the same or substantially the same as that described FIG. 1.

In the SSD 1200, the nonvolatile memory device 1230 may operate the same substantially the same as a nonvolatile memory device of FIG. 2 or 13. That is, the nonvolatile memory device 1230 may output at least one of sensed data, a result of an XOR operation on sensed data, and the number of logic '1' included in a result of the XOR operation according to a command of the SSD controller 1210.

Figure 19:
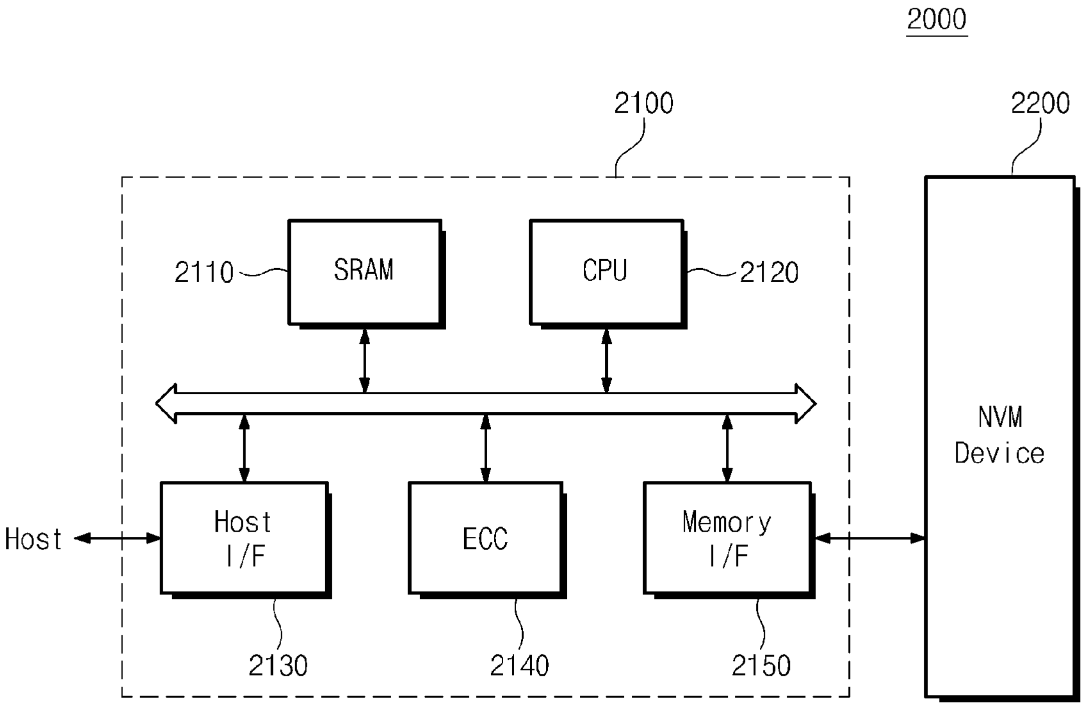
FIG. 19 is a block diagram illustrating a memory system according to still another example embodiment of inventive concepts.

FIG. 19 is a block diagram illustrating a memory system according to still another example embodiment of inventive concepts. Referring to FIG. 19, a memory system 2000 may include a memory controller 2100 and a nonvolatile memory 2200.

The nonvolatile memory 2200 may be configured the same or substantially the same as that described FIG. 2 or 13, and a description thereof is thus omitted.

The memory controller 2100 may be configured to control the nonvolatile memory 2100. An SRAM 2110 may be used as a working memory of a CPU 2120. A host interface 2130 may include a data exchange protocol of a host connected with the memory system 2000. An ECC block 2140 may be configured to detect and correct errors included in data read out from the nonvolatile memory 2100. A memory interface 2150 may interface with the nonvolatile memory 2200 according to an example embodiment of inventive concepts. The CPU 2120 may execute an overall control operation for data exchange of the memory controller 2100. Although not shown in FIG. 19, the memory system 2000 may further include ROM which stores code data for interfacing with the host.

The memory controller 2100 may communicate with an external device (e.g., host) via one of interface protocols such as USB, MMC, PCI-E, SAS, SATA, PATA, SCSI, ESDI, IDE, and the like. The memory controller 2100 may decide a read voltage on selected memory cells using the regression analysis. The regression analysis may be executed through firmware or a specific function block.

In example embodiments, the memory system 2000 may be used as computer, portable computer, Ultra Mobile PC (UMPC), workstation, net-book, PDA, web tablet, wireless phone, mobile phone, smart phone, digital camera, digital audio recorder/player, digital picture/video recorder/player, a device capable of transmitting and receiving information at a wireless circumstance, or one of various user devices constituting home network.

Figure 20:
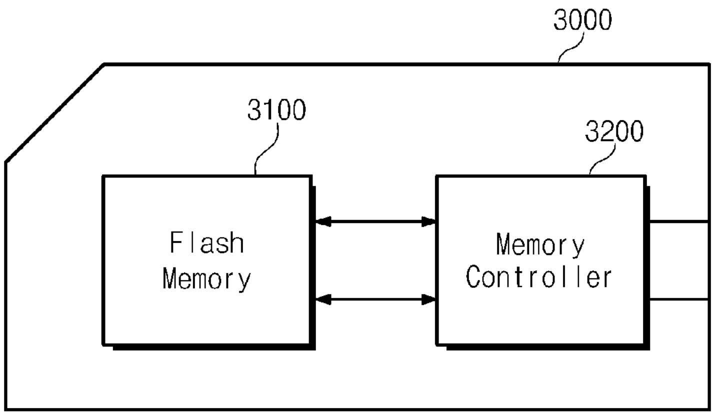
FIG. 20 is a block diagram illustrating a data storage device according to another example embodiment of inventive concepts.

FIG. 20 is a block diagram illustrating a data storage device according to another example embodiment of inventive concepts. Referring to FIG. 20. A data storage device 3000 may include a flash memory 3100 and a memory controller 3200. The memory controller 3200 may control the flash memory 3100 in response to control signals input from the outside of the data storage device 3000.

In the data storage device 3000, the flash memory 3100 may be configured the same or substantially the same as a nonvolatile memory device of FIG. 2 or 13. That is, the flash memory 3100 may read data from selected memory cells using different read voltages to output it to the memory controller 3200. Alternatively, the flash memory 3100 may execute an XOR operation on data read from selected memory cells to output a result of the XOR operation to the memory controller 3200. Still alternatively, the flash memory 3100 may provide the memory controller 3100 with the number of logic '1' included in a result of an XOR operation on data read from selected memory cells.

The memory controller 3200 may execute the regression analysis for deciding an optimal read level of the selected memory cells based on data from the flash memory 3100. The regression analysis may enable a higher reliability read level to be decided through reduced and/or minimum read operations.

The data storage device 3000 may be a memory card device, an SSD device, a multimedia card device, an SD card, a memory stick device, a HDD device, a hybrid drive device, or an USB flash device. For example, the data storage device 3000 may be a card which satisfies the standard for user devices such as a digital camera, a personal computer, and so on.

Figure 21:
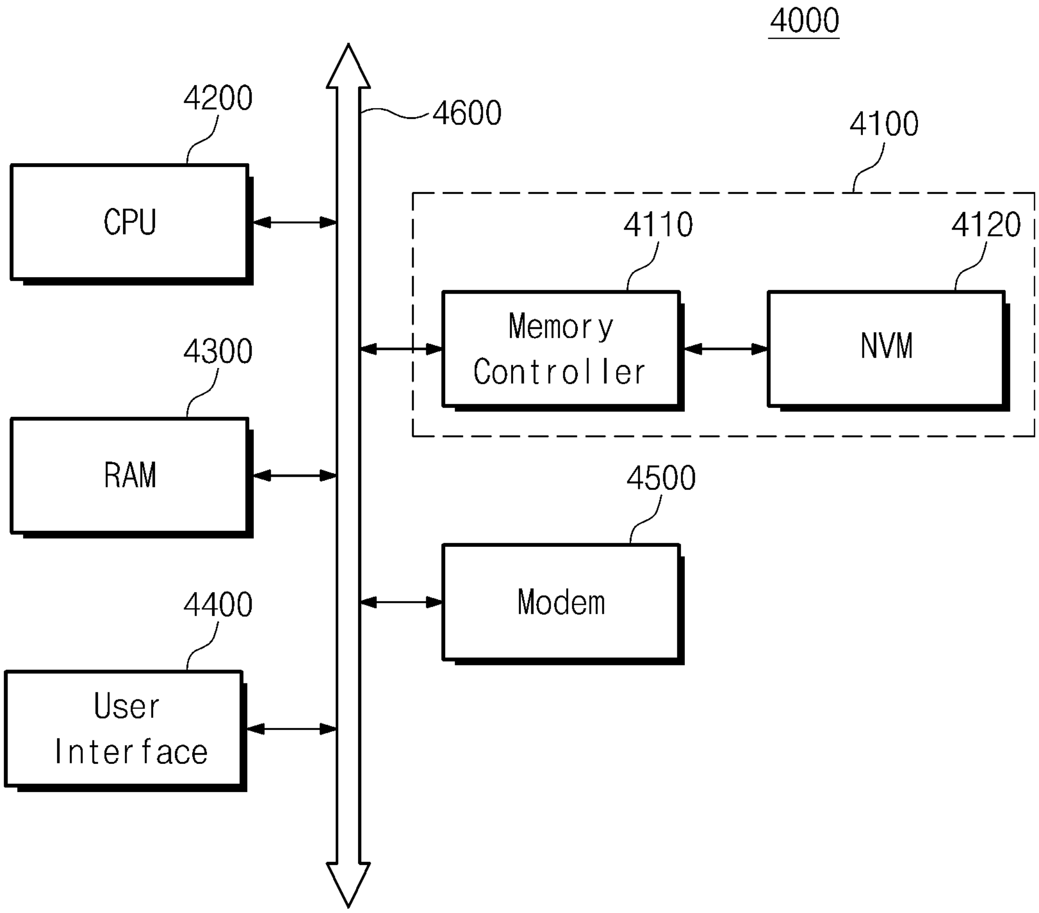
FIG. 21 is a block diagram illustrating a computing system including a flash memory device according to an example embodiment of inventive concepts.

FIG. 21 is a block diagram illustrating a computing system including a flash memory device according to an example embodiment of inventive concepts. A computing system 4000 may include memory system 4100, a CPU 4200, a RAM 4300, a user interface 4400, and a modem 4500 such as a baseband chipset which are electrically connected with a system bus 4600. The memory system 4100 may be configured the same or substantially the same as that illustrated in FIG. 1, 12, 15, 18, 19, or 20.

If the computing system 4000 is a mobile device, then it may further include a battery (not shown) which powers the computing system 4000. Although not shown in FIG. 21, the computing system 3000 may further include an application chipset, a camera image processor (CIS), a mobile DRAM, and the like. The memory system 3100 may be a solid state drive/disk (SSD) which uses a nonvolatile memory to store data. The memory system 4100 may decide an optimal read level through the regression analysis according to example embodiments of inventive concepts. Thus, the data integrity may be improved.

A semiconductor device and/or a controller may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While inventive concepts has been described with reference to example embodiments, it will be apparent to those skilled in the art that various changes and modifications may be made without departing from the spirit and scope of the present invention. Therefore, it should be understood that the above example embodiments are not limiting, but illustrative.

What is claimed is:

1. A method of reading a nonvolatile memory, the nonvolatile memory device including a plurality of memory cells having a three-dimensional structure, the method comprising:

reading selected memory cells using a plurality of read voltages;

performing an XOR operation between two read data units among a plurality of read data units, each of the plurality of read data units corresponding to the plurality of the read voltages; and determining an optimum read voltage of the selected memory cells based on a result of the XOR operation.

2. The method of claim 1, wherein the performing an XOR operation comprises:

performing the XOR operation on data bits of a first data unit associated with a first of the plurality of read voltages and data bits of a second data unit associated with a second of the plurality of read voltages, to count a number of memory cells having a threshold voltage between the first of the plurality of read voltages and the second of the plurality of read voltages, wherein the data bits of the first and second data units correspond to a same column of the selected memory cells.

3. The method of claim 2, wherein an average of the first and second of the plurality of read voltages is decided as a first component of a coordinate value and a number of the memory cells is decided as a second component of the coordinate value.

4. The method of claim 3, wherein the determining an optimum read voltage comprises:

obtaining a plurality of coordinate values based on the result of the XOR operation;

determining a probability density function on the threshold voltage of the selected memory cells using the plurality of coordinate values; and deciding, as the optimum read voltage of the selected memory cells, a threshold voltage of a coordinate value, among the plurality of coordinate values, at which a slope of the probability density function is '0'.

5. The method of claim 4, wherein the probability density function corresponds to a distribution valley between states of the selected memory cells; and the probability density function is modeled to a quadratic function or a cubic function on the threshold voltage.

6. The method of claim 5, wherein a derivation of the quadratic function is based on a read result of at least four of the plurality of read voltages.

7. The method of claim 5, wherein a derivation of the cubic function is based on a read result of at least five of the plurality of read voltages.

8. The method of claim 1, wherein the XOR operation is performed in the nonvolatile memory device.

9. A method of reading a nonvolatile memory device having a three-dimensional structure, the method comprising:

reading selected memory cells using a first read voltage, a second read voltage larger that the first read voltage, a third read voltage larger than the second read voltage, and a fourth read voltage larger than the third read voltage;

performing each of an XOR operation between first data read by the first read voltage and second data read by the second read voltage, an XOR operation between the second data and third data read by the third read voltage, an XOR operation between the third data and fourth data read by the fourth read voltage, respectively;

modeling a distribution valley function on a threshold voltage of the selected memory cells, based on results of the XOR operations; and determining an optimum read voltage of the selected memory cells based on a search operation of a threshold voltage at which a slope of the distribution valley function is '0'.

10. The method of claim 9, wherein the nonvolatile memory device performs the XOR operations and outputs each result of the XOR operations.

11. The method of claim 9, wherein the nonvolatile memory device performs the XOR operations and outputs a number of logic '1' included in each result of the XOR operations.

12. The method of claim 9, wherein the modeling a distribution valley function comprises:

generating the distribution valley function by substituting the results of the XOR operations to solve simultaneous equations on the distribution valley function.

13. The method of claim 9, further comprising:

reading the selected memory cells using a fifth read voltage larger than the fourth read voltage; and performing an XOR operation between the fourth data and fifth data read by the fifth read voltage;

wherein the distribution valley function corresponding to the quadratic function is modeled by using the first to fourth data; and wherein the distribution valley function corresponding to the cubic function is modeled by using the first to fifth data.

14. A storage device comprising:

a nonvolatile memory device including a plurality of memory cells having a three-dimensional structure, the nonvolatile memory device configured to read data from selected memory cells using a plurality of read voltages, and further configured to perform an XOR operation between data read by the plurality of read voltages; and a memory controller configured to find a distribution valley function on a threshold voltage of the selected memory cells based on a result of the XOR operation, and to decide an optimum read voltage of the selected memory cells through an analysis of the distribution valley function, wherein the plurality of read voltages include at least four different voltage levels.

15. The storage device of claim 14, wherein at least five different read voltages are applied to the selected memory cells to estimate the distribution valley function corresponding to a distribution between an erase state and a program state of the selected memory cells.

16. The storage device of claim 14, wherein the nonvolatile memory device is configured to execute the XOR operation on bits in the same column of data read by the plurality of read voltages.

17. The storage device of claim 14, wherein the nonvolatile memory device comprises:

a bit counter configured to generate a plurality of count values based on data read from the selected memory cells, each of the plurality of count values being indicative of a number of memory cells having threshold voltages between adjacent pairs of the four different read voltages.

18. The storage device of claim 17, wherein the bit counter is further configured to count a number of logic '1' included in a result of the XOR operation between read data corresponding to the adjacent pairs of the four different read voltages.

19. The storage device of claim 14, wherein the memory controller comprises:

a regression analyzer configured to decide the optimum read voltage of the selected memory cells through performing the analysis of the distribution valley function.

20. The storage device of claim 19, wherein the regression analyzer is further configured to determine the optimum read voltage based on a minimum value of the distribution valley function.

* * * * *